United States Patent
Matsumoto et al.

[11] Patent Number: 5,859,799
[45] Date of Patent: Jan. 12, 1999

[54] SEMICONDUCTOR MEMORY DEVICE INCLUDING INTERNAL POWER SUPPLY CIRCUIT GENERATING A PLURALITY OF INTERNAL POWER SUPPLY VOLTAGES AT DIFFERENT LEVELS

[75] Inventors: Yasuhiro Matsumoto; Mikio Asakura; Kouji Tanaka; Kyoji Yamasaki, all of Hyogo, Japan

[73] Assignee: Mitsubishi Denki Kabushiki Kaisha, Tokyo, Japan

[21] Appl. No.: 975,151

[22] Filed: Nov. 20, 1997

[30] Foreign Application Priority Data

Apr. 4, 1997 [JP] Japan .................................. 9-086250

[51] Int. Cl.$^6$ ...................................................... G11C 7/00
[52] U.S. Cl. ................ 365/189.09; 365/226; 365/189.11
[58] Field of Search ............................... 365/189.09, 226, 365/227, 228, 205, 207, 203.06

[56] References Cited

U.S. PATENT DOCUMENTS 5,592,421  1/1997  Kaneko et al. ......................... 365/226
5,710,741  1/1998  McLaury ................................. 365/226

*Primary Examiner*—Vu A. Le
*Attorney, Agent, or Firm*—McDermott, Will & Emery

[57] ABSTRACT

A plurality of internal power supply voltage generating circuits generate internal power supply voltages. A column select signal at the same voltage level as a first internal power supply voltage applied to a sense amplifier is generated to an I/O gate circuit connecting a bit line pair and an internal data line pair together. A current driving capability of an I/O gate circuit is made relatively small, so that rapid change in potential on a sense node of a sense amplifier is prevented. Thereby, inversion of latched data of the sense amplifier due to collision of data is prevented in such a case voltages on the internal data line pair are not equalized sufficiently.

6 Claims, 14 Drawing Sheets

5,859,799

SEMICONDUCTOR MEMORY DEVICE INCLUDING INTERNAL POWER SUPPLY CIRCUIT GENERATING A PLURALITY OF INTERNAL POWER SUPPLY VOLTAGES AT DIFFERENT LEVELS

BACKGROUND OF THE INVENTION

1. Field of the Invention

The present invention relates to a semiconductor memory device, and in particular to a semiconductor memory device which has an internal power supply voltage generating circuit for generating a plurality of internal power supply voltages at different voltage levels.

2. Description of the Background Art

FIG. 17 schematically shows a whole structure of a semiconductor memory device in the prior art. In FIG. 17, a semiconductor memory device includes a memory cell array 900 which has a plurality of memory cells MC arranged in a matrix form. In this memory cell array 900, a word line WL is arranged corresponding to each row of memory cells MC, and a bit line pair BLP is arranged corresponding to each column of memory cells MC. Each word line WL is connected to memory cells MC in the corresponding row, and each bit line pair BLP is connected to memory cells MC in the corresponding column. As will be described later further in detail, each bit line pair BLP has bit lines BL and /BL transmitting data signals complementary with each other.

The semiconductor memory device further includes an address buffer 902 which receives an externally supplied address signal and generates an internal address signal, a row select circuit 904 which drives the word line corresponding to an addressed row in memory cell array 900 to the selected state in accordance with an internal row address signal generated from address buffer 902, a column select circuit 906 which generates a column select signal for selecting the addressed column in memory cell array 900 in accordance with an internal column address signal generated from address buffer 902, sense amplifiers which are arranged corresponding to the respective bit line pairs BLP in memory cell array 900 for differentially amplifying potentials on the corresponding bit line pairs when made active, and I/O gates which connect a bit line pair corresponding to an addressed column in memory cell array 900 to an internal I/O bus line 907 in accordance with the column select signal generated from column select circuit 906, respectively. In FIG. 17, the sense amplifiers and the I/O gates are represented by one block 908.

The semiconductor memory device further includes an I/O buffer 910 for performing input/output of data into and from the device, and a read/write circuit 912 for transmitting internal data between I/O buffer 910 and internal I/O line 907. Read/write circuit 912 includes a preamplifier which amplifies memory cell data read from memory cell array 900 for transmission to an output buffer included in I/O buffer 910, and a write driver which produces and transmits write data to internal I/O bus 907 at a predetermined timing in accordance with the internal write data received from an input buffer included in I/O buffer 910.

Further, the semiconductor memory device includes a timing control circuit 914, which receives externally supplied control clock signals, i.e., a row address strobe signal /RAS, a column address strobe signal /CAS and a write enable signal /WE, and generates control signals for controlling operations related to the row selection and input/output of data, and an ATD circuit 916 which operates in accordance with the internal signal from timing control circuit 914, and detects a transition in the internal column address signal from address buffer 902. An address transition detection signal ATD generated from ATD circuit 916 is applied to timing control circuit 914 for determining operation timings of the circuits related to the column selection.

Row address strobe signal /RAS determines a standby cycle and an active cycle of this semiconductor memory device. When row address strobe signal /RAS is activated and attains L-level, the semiconductor memory device enters the active cycle and performs the memory cell selecting operation. Column address strobe signal /CAS determines the timing for latching the column address signal and the timing for input/output of data. Write enable signal /WE designates the mode for writing/reading data. The timing of reading out data is determined by activation of column address strobe signal /CAS. The timing of data input is determined by activation of both column address strobe signal /CAS and write enable signal /WE.

ATD circuit 916 is activated at a predetermined timing after row address strobe signal /RAS is activated, and determines the operation timings of column select circuit 906 and read/write circuit 912 as well as the timing of internally reading out data at I/O buffer 910.

In the following description, the term "row-related operations" represents a series of operations staring from input of a row address to amplification of stored data in the corresponding memory cells by the sense amplifiers. The term "column-related operations" represents operations starting from input of a column address to connection of an addressed bit line pair to the internal I/O line pair and subsequent reading/writing of data from or into the memory cell. The row-related operation is driven by row address strobe signal /RAS. The column-related operation is triggered by address transition detection signal ATD. Usually, column address strobe signal /CAS drives the column-related operation. However, the address access time from application of the address signal to data reading depends on specifications, and the triggering by the address transition detection signal ATD is employed for performing operations accurately based on this access time.

FIG. 18 schematically shows a structure of a portion in memory cell array 900 and block 908 related to one column in the semiconductor memory device shown in FIG. 17. In FIG. 18, bit line pair BLP has bit lines BL and /BL which are complementary with each other. Bit line pair BLP is connected to memory cells MC on one column. FIG. 18 representatively shows a memory cell MC arranged corresponding to a crossing between one word line WL and bit line BL. Memory cell MC includes a memory cell capacitor MQ for storing information, and an access transistor MT formed of an n-channel MOS transistor which is turned on to connect memory cell capacitor MQ to corresponding bit line BL in response to a signal potential on word line WL. Memory cell capacitor MQ is supplied on one electrode node, i.e., cell plate electrode node with a cell plate voltage Vcp of a constant value equal to half the power supply voltage. Based on this cell plate voltage Vcp, positive or negative electric charges are accumulated on the other electrode node, i.e., storage node of the memory cell capacitor MQ.

For bit lines BL and /BL, there is arranged an equalize/precharge circuit 901 for equalizing bit lines BL and /BL to an intermediate voltage Vbl in response to a bit line equalize instructing signal φBQ. This bit line precharge voltage Vbl is also at the intermediate voltage level equal to half the power supply voltage Vcc. Bit line equalize instructing signal φBQ is active during the standby cycle, and is inactive during the active cycle.

Block 908 of the sense amplifiers and I/O gates includes a sense amplifier circuit 908a which is provided for each bit line pair BL and /BL, and is activated to amplify differentially potentials on bit lines BL and /BL in response to activation of sense amplifier activating signal φSA, and an I/O gate circuit 908b which is turned on in accordance with column select signal CSL from column select circuit 906 (see FIG. 17), and connects bit lines BL and /BL to an internal data line pair 907a included in internal I/O bus 907. I/O gate circuit 908b includes n-channel MOS transistors provided for bit lines BL and /BL, respectively. An operation of the semiconductor memory device shown in FIGS. 17 and 18 will be described below with reference to a waveform diagram of FIG. 19.

Before time t1, row address strobe signal /RAS is at H-level and inactive, and the semiconductor memory device is in the standby cycle. In this state, bit line equalize instructing signal φBQ is at H-level and inactive, so that equalize/precharge circuit 901 is activated, and bit lines BL and /BL are precharged to the intermediate level of Vb1. Word line WL is in the nonselected state and at L-level, and column select signal CSL is also in the nonselected state of L-level.

At time t1, row address strobe signal /RAS falls to L-level, so that the active cycle starts, and the memory cell select operation starts. In accordance with falling of row address strobe signal /RAS, externally applied address signal AD is taken and applied into row select circuit 904 as a row address signal X. Row select circuit 904 is activated under the control of timing control circuit 914, and drives word line WL provided corresponding to the row X corresponding to row address signal X to the selected state. In response to falling of row address strobe signal /RAS, bit line equalize instructing signal φBQ is set to the inactive state of L-level, so that equalize/precharge circuit 901 is deactivated, and bit lines BL and /BL are electrically floated at precharge voltage Vb1.

When word line WL is selected to have potential raised, access transistor MT shown in FIG. 18 is turned on, and charges accumulated in memory cell capacitor MQ are transmitted onto bit line BL. FIG. 19 shows, as an example, change in potential on bit line BL in the case where memory cell MC has stored data of H-level. When a potential difference between bit lines BL and /BL sufficiently increases, sense amplifier activation signal φSA is activated, and sense amplifier circuit 908a (see FIG. 18) differentially amplifies the potentials on bit lines BL and /BL. Thereby, the potential on bit line BL attains the power supply voltage Vcc level, i.e., H-level, and the potential on bit line /BL attains the ground voltage level, i.e., L-level.

In parallel with this sensing operation of the sense amplifier, the address signal is taken in as a column address signal Y in accordance with column address strobe signal /CAS, and the column select operation starts. This column select operation is actually performed after completion of the sense amplifier. After the sensing operation is completed at time t2, the column select operation is performed in accordance with column address strobe signal /CAS. At time t3, column select signal CSL attains H-level or the selected state, so that I/O gate circuit 908b is turned on, and bit lines BL and /BL are connected to internal I/O line pair 907a. Internal I/O line pair 907a has been equalized by an equalize circuit (not shown), and the potentials on internal data line pair 907a are driven by sense amplifier circuit 908a to H- and L-levels, respectively. Thereafter, writing/reading of data for the selected column is performed.

Then, row address strobe signal /RAS is deactivated to attain H-level, so that the potential on word line WL lowers to L-level, and sense amplifier activating signal φSA is deactivated. Then, bit line equalize instructing signal φBQ attains the active state of H-level. Thereby, bit lines BL and /BL are precharged and equalized again to the intermediate voltage level, i.e., precharge voltage Vb1 level. When column address strobe signal /CAS is deactivated to attain H-level, column select signal CSL falls to L-level.

FIG. 20 schematically shows a structure including the timing control circuit, row select circuit and column select circuit in the semiconductor memory device shown in FIG. 17. In FIG. 20, word line WL, bit line pair BLP and I/O gate circuit 908b connected to bit line pair BLP are representatively shown as components in memory cell array 900.

Timing control circuit 914 includes an RAS buffer 914a which receives externally applied row address strobe signal /RAS and produces internal row address strobe signal int/RAS, an address control circuit 914b which produces signals RAL, RADE and CAI for controlling the address take-in timing in accordance with internal row address strobe signal int/RAS, a bit line equalize control circuit 914c which generates bit line equalize instructing signal φBQ in accordance with internal row address strobe signal /RAS from RAS buffer 914a, a word line drive control circuit 914d which generate a word line drive signal RX determining a timing of driving of the word line to the selected state in accordance with internal row address strobe signal int/RAS, and a sense amplifier control circuit 914e which generates sense amplifier activating signal φSA in accordance with internal row address strobe signal /RAS and bit line equalize instructing signal φBQ generated from bit line equalize control circuit 914c.

The timing control circuit 914 further includes a column-related interlock control circuit 914f which produces column address enable signal CADE and column enable signal /CE for controlling operations of the column-related circuits. Column-related interlock control circuit 914f drives column enable signal /CE and column address enable signal CADE to the active state when a predetermined time elapses after sense amplifier activating signal φSA is activated. In accordance with activation of column address enable signal /CE, the column-related circuits are enabled. In accordance with activation of column address strobe signal CADE, production of the internal column address is allowed.

Timing control circuit 914 further includes a CAS buffer 914g which receives externally applied column address strobe signal /CAS and produces a column address latch instructing signal CAL, an output control circuit 914i which produces a data transfer instructing signal DT for controlling transmission of data to an output buffer from a read circuit (preamplifier) included in a read/write circuit in accordance with write enable signal /WE and the internal column address strobe signal from CAS buffer 914g, and a column-related control circuit 914h which generates control signals for the column-related circuits in accordance with the address transition detection signal from ATD circuit 916. As the signals generated from column-related control circuit 914h, FIG. 20 shows a column decoder enable signal CDE to column decoder (column select circuit) 906a, and an equalize instructing signal IOEQ to I/O equalize circuit 920 provided to internal data line pair 907a.

Column decoder 906a is included in column select circuit 906 shown in FIG. 17. Column select circuit 906 may include a column predecoder. Column decoder 906a generates column select signal CSL to I/O gate circuit 908b. I/O equalize circuit 920 equalizes potentials on internal data line pair 907a when data line equalize instructing signal IOEQ is active.

Address buffer 902 includes a row address buffer 902r which receives the externally applied address signal and generates the internal row address signal, and a column address buffer 902c which receives the externally applied address signal and generates the internal column address signal.

Row address buffer 902r includes an address latch circuit 902ra which takes in and latches the externally applied address signal in accordance with row address latch instructing signal RAL from address control circuit 914b, and an internal address generating circuit 902rb which generates complementary internal row address signals in accordance with the internal row address signal from row address latch circuit 902ra in response to activation of row address enable signal RADE from address control circuit 914b.

The complementary internal row address signals generated from internal address generating circuit 902rb are applied to a row decoder/driver 904a included in the row select circuit. Row decoder/driver 904a decodes the address signal from internal address generating circuit 902rb, and drives the word line corresponding to the addressed row to the selected state in accordance with word line drive signal RX from word line drive control circuit 902d. Row select circuit 904 may include a row predecoder in addition to row decoder/driver 904a.

ATD circuit 916 is activated in response to activation of column enable signal /CE from column-related interlock control circuit 914f. Now, an operation of the timing control circuit shown in FIG. 20 will be described below with reference to signal waveform diagrams of FIGS. 21 and 22.

Referring to FIG. 21, description will first be given on an operation in the case where column address strobe signal /CAS is activated prior to activation of column enable signal /CE.

Before time t1, row address strobe signal /RAS and column address strobe signal /CAS are at H-level or inactive. The semiconductor memory device is in standby state. Row address latch instructing signal RAL from address control circuit 914b is inactive, and column address inhibiting signal CAI is active. In this state, row address latch circuit 902ra generates the internal address signal in accordance with the externally applied address signal. Column address buffer 902c is inhibited from taking in the externally applied address signal in accordance with activation of column address inhibiting signal CAI. I/O equalize circuit 920 equalizes internal data line pair 907a to a predetermined voltage level in accordance with activation of data line equalize instructing signal IOEQ.

When row address strobe signal /RAS falls to L-level and is activated at time t1, the active cycle starts. In response to falling of row address strobe signal /RAS, bit line equalize instructing signal φBQ generated from bit line equalize control circuit 914c attains L-level, so that equalization of the bit line pair stops. In response to falling of row address strobe signal /RAS, row address latch instructing signal RAL rises to H-level, and the address latch circuit 902ra attains the latching state. Then, row address enable signal RADE is activated, and the complementary internal row address signals from internal address generating circuit 902rb attain states according to the address signal latched by address latch circuit 902ra.

When address latch circuit 902ra completes latching of the row address, column address inhibiting signal CAI is deactivated, and column address buffer 902c is enabled to take in the externally supplied address signal.

The row select operation is performed in accordance with address signal X which is taken in and latched in accordance with falling of row address strobe signal /RAS. More specifically, word line drive control circuit 914d generates word line drive signal RX at a predetermined timing, and row decoder/driver 904a drives the addressed word line to the selected state in accordance with word line drive signal RX. Then, sense amplifier activating signal φSA generated from sense amplifier control circuit 914e is activated at time t2, so that sensing and amplification of data of the memory cells connected to the selected word line are performed.

At time t2 after a delay from activation of sense amplifier activating signal φSA, column address strobe signal /CAS attains the active state of L-level, and correspondingly column address latch instructing signal CAL attains the active state of H-level. Thereby, column address buffer 902c latches the externally applied address signal. In this state, column enable signal /CE is still inactive, and ATD circuit 916 is also inactive. Further, column address enable signal CADE is inactive. All the internal column address signals from column address buffer 902c are inactive, so that the column select operation is not performed.

At time t3 after elapse of a predetermined time from activation of sense amplifier activating signal φSA, column enable signal /CE from column-related interlock control circuit 914f attains the active state of L-level, and column address enable signal CADE also attains the active state of H-level. Although the address signal changes its level before time t2, the column enable signal /CE is kept at the inactive state of H-level, and the address transition detection signal ATD holds H-level. In accordance with activation of this column address enable signal CADE, the internal address signal from column address buffer 902c attains the state corresponding to the address signal which has already been latched. ATD circuit 916 is activated to lower the address transition detection signal ATD to L-level for application to column-related control circuit 914h in response to activation of column enable signal /CE. Column related control circuit 914h drives column decoder enable signal CDE to the active state in response to falling of address transition detection signal ATD. Responsively, column decoder 906a decodes the complementary internal column address signals from column address buffer 902c, and drives column select signal CSL to the selected state for driving the addressed column to the selected state.

At the same time, column related control circuit 914h drives internal data line equalize instructing signal IOEQ to the inactive state, so that I/O equalize circuit 920 is deactivated and stops equalizing of the internal data line. Thereby, data on bit line pair BLP is transmitted through I/O gate circuit 908b onto internal data line pair 907a, and is further transmitted to the read/write circuit, whereby data is written into or read from the selected memory cell.

At time t4, row address strobe signal /RAS rises to H-level, so that the semiconductor memory device returns to the standby state. In response to rising of row address strobe signal /RAS, row address enable signal RADE attains the inactive state of L-level, and subsequently the row address latch instructing signal RAL attains the inactive state of L-level. Thereby, the address latch circuit 902ra is set to the state for incorporating the externally applied address signal. Also, internal address generating circuit 902rb drives the internal address signal together with its complementary internal address signal to the nonselected state.

In response to rising of row address strobe signal /RAS, word line drive signal RX and sense amplifier activating signal φSA are driven to the inactive state. In response to deactivation of sense amplifier activating signal φSA, column address enable signal CADE and column enable signal /CE are deactivated.

In response to rising of row address strobe signal /RAS, column address inhibiting signal CAI rises to H-level, so that column address buffer 902c is inhibited from taking in the externally applied address signal. Also, column enable signal /CE is set to the inactive state of H-level, and responsively address transition detection signal ATD from ATD circuit 916 rises to H-level. Column decoder enable signal CDE is deactivated, and I/O equalize circuit 920 is activated to equalize internal data line pair 907a to a predetermined voltage level in response to activation of internal data line equalize instructing signal IOEQ.

Then, column address strobe signal /CAS rises to H-level, and column address latch instructing signal CAL attains L-level. Further, bit line equalize instructing signal φBQ is set to the active state of H-level, and potentials on bit line pair BLP is precharged and equalized.

In the operation shown in FIG. 21, if column address strobe signal /CAS is activated prior to activation of column enable signal /CE, the column select operation starts in accordance with the activation of column enable signal /CE, so that the selected memory cell is accessed.

Referring to FIG. 22, description will be given on an operation in the case where column address strobe signal /CAS is set to the active state of L-level after activation of column enable signal /CE.

At time t0, row address strobe signal /RAS is set to the active state of L-level. In accordance with activation of row address strobe signal /RAS, currently applied address signal AD is taken in as row address signal (X) for performing the row select operation. In accordance with this select operation, data of the memory cells connected to the selected word line are read onto the corresponding bit lines, respectively. FIG. 22 representatively shows two bit line pairs BLP0 and BLP1. FIG. 22 specifically shows, by way of example, waveforms in such a case that data of H-level is read onto bit line pair BLP0, and data of L-level is read onto bit line pair BLP1.

In this state, column enable signal /CE and column address enable signal CADE are both inactive, and generation of the internal column address signal and column select operation are inhibited.

When the sense amplifier is activated and data signals on each bit line pair are fixed at H- and L-levels in accordance with the selected memory cell data, respectively, column address enable signal CADE and column enable signal /CE from the column related interlock control circuit shown in FIG. 20 are activated at time t1. Since row address strobe signal /RAS is in the active state of L-level and column address strobe signal /CAS is at H-level, column address buffer 902c takes in the applied address signal, and generates the complementary column address signals in accordance with column address enable signal CADE. The internal column address signal from column address buffer 902c has already changed its state, and ATD circuit 916 lowers address transition detection signal ATD to L-level in response to falling of column enable signal /CE.

In response to falling of address transition detection signal ATD, column decoder enable signal CDE is activated, and internal data line equalize instructing signal IOEQ is deactivated. Then, column decoder 906a performs the column select operation in accordance with currently applied address signal Y0. FIG. 22 shows a waveform in such a case that bit line pair BLP0 is selected in accordance with column address signal Y0, and data of H-level on bit line pair BLP0 is read.

At time t2, the address signal changes its state. Even in this state, column address strobe signal /CAS is still at H-level, and ATD circuit 916 generates address transition detection signal ATD of one shot. In response to activation (rising) of address transition detection signal ATD, column decoder enable signal CDE is set to the inactive state of L-level, and internal data line equalize instructing signal IOEQ is set to the active state at H-level. Thereby, the column select operation according to internal column address signal Y0 stops. Bit line pair BLP0 is isolated from internal data line pair 907a, and I/O equalize circuit 920 equalizes internal data line pair 907a to a predetermined voltage level.

This address transition detection signal ATD is a pulse signal of one shot having a predetermined time width. When address transition detection signal ATD falls to L-level again, column decoder enable signal CDE is activated, and internal data line equalize instructing signal IOEQ is set to the inactive state of L-level. Thereby, the operation of equalizing internal data line pair 907a is completed, and the column select operation is performed in accordance with address signal Y1. Also, bit line pair BLP1 is connected to internal data line pair 907a.

At time t3, equalizing of internal data line pair 907a is to be completed. Even if equalizing of internal data line pair 907a is not yet completed at this time t3, the sense amplifier circuit provided at bit line pair BLP1 functions to change the data on internal data line pair 907a in accordance with data of L level on bit line pair BLP1.

At time t4, column address strobe signal /CAS falls to L-level. Thereby, column address latch instructing signal CAL shown in FIG. 19 is activated, and column address buffer 902c attains the address latching state. While this state is kept, the internal column address signal does not change.

As shown in FIG. 22, column address strobe signal /CAS may be activated after activation of column enable signal /CE. In this case, column address buffer 902c is activated even if internal row address signal X of address signal AD does not change. Column address buffer 902c thus activated produces the complementary internal column address signals in accordance with the currently applied address signal, and lowers address transition detection signal ATD to L-level for column selection in accordance with activation of column enable signal /CE. When the address signal changes thereafter, address transition detection signal ATD from ATD circuit 916 is activated, so that the column select operation is performed. This operation is repeated in accordance with transition in the address signal and the column-related circuits operate until column address strobe signal /CAS is activated. Column address strobe signal /CAS functions only to provide timings for externally inputting and outputting data and a timing for latching the column address signal.

In this case, a period for equalizing internal data line pair 907a depends on a pulse width of address transition detection signal ATD. If address transition detection signal ATD has a sufficiently large pulse width, i.e., if internal data line equalize instructing signal IOEQ has a sufficiently large pulse width, the internal data line pair is reliably equalized to a predetermined voltage level. In this case, however, the column select operation starts with a delay, so that fast access cannot be achieved. Therefore, it is impossible to increase the period for equalizing the internal data line pair (the column decoder is activated after deactivation of the internal data line pair equalize signal). The column select operation described above usually occurs in the fast serial access mode such as a page mode, and it is necessary to provide a countermeasure for reliably reading memory cell data even in the case of insufficient equalizing of the internal data line pair.

FIG. 23 shows a structure of a portion including the sense amplifier circuit and I/O gate circuit. In FIG. 23, sense amplifier circuit SA (908a) includes a p-channel MOS transistor P1 which has a one conduction node connected to a sense node SNDa and a gate connected to a sense node SNDb, a p-channel MOS transistor P2 which has a one conduction node connected to sense node SNDb and a gate connected to sense node SNDa, and a p-channel MOS transistor P3 which is responsive to activation of a sense amplifier activating signal φSP for transmitting power supply voltage Vcc to the other conduction node (source) of each of p-channel MOS transistors P1 and P2. Sense node SNDa is located on bit line BL, and sense node SNDb is located on bit line /BL.

Sense amplifier circuit SA further includes an n-channel MOS transistor N1 which has a one conduction node connected to sense node SNDa and a gate connected to sense node SNDb, an n-channel MOS transistor N2 which has a one conduction node connected to sense node SNDb and a gate connected to sense node SNDa, and an n-channel MOS transistor N3 which is turned on, in response to activation of sense amplifier activating signal φSN, to transmit ground voltage Vss to the other conduction node terminal (source) of each of n-channel MOS transistors N1 and N2.

This sense amplifier circuit SA drives one of sense nodes SNDa and SNDb, which is at a higher potential, to power supply voltage Vcc level, and also drives the other at a lower potential to the ground voltage level.

I/O gate circuit 908b includes transfer gates Ta and Tb each formed of an n-channel MOS transistor and turned on to connect bit lines BL and /BL to internal data bus lines 907aa and 907bb, respectively in response to activation of column select signal CSLa. I/O equalize circuit 920 is provided for internal data bus lines 907aa and 907ab. I/O equalize circuit 920 includes an n-channel MOS transistor, which is turned on to electrically short-circuits internal data lines 907aa and 907ab in response to activation of internal data line equalize instructing signal IOEQ. An operation of the sense amplifier circuit and I/O gate circuit shown in FIG. 23 will be briefly described below.

In the following operation, it is assumed that, as shown in FIG. 23, the potential on bit line BL is at ground voltage Vss level, or at L-level, and bit line /BL is at power supply voltage Vcc level or at H-level. Data of H-level has been read onto internal data lines 907aa and 907ab from unillustrated another bit line pair, so that internal data lines 907aa and 907ab are at H- and L-levels, respectively. Further, a parasitic capacitance Cp is present at each of internal data lines 907aa and 907ab.

As shown in FIG. 24, data is read onto the internal data lines 907aa and 907ab from the unillustrated bit line pair, so that the potentials on internal data lines 907aa and 907ab are at H- and L-levels, respectively. When the address signal changes, internal data line equalize instructing signal IOEQ is activated to attain H-level at time ta, so that internal data lines 907aa and 907ab are electrically short-circuited, and the potentials thereon change toward the intermediate potential level. This change in potential is caused by transfer of electric charges accumulated in parasitic capacitance Cp. When internal data line equalize instructing signal IOEQ is deactivated at time tb, equalizing of internal data lines 907aa and 907ab stops. At time tb, the potentials on internal data lines 907aa and 907ab are not completely equalized, and the potential on internal data line 907aa is at a level slightly higher than that on internal data line 907ab.

In this state, column select signal CSLa is driven to the selected state at time tb, and I/O gate circuit 908b is turned on, so that bit lines BL and /BL are electrically connected to internal data lines 907aa and 907ab. Sense amplifier circuit SA holds the potentials on bit lines BL and /BL at L- and H-levels through sense nodes SNDa and SNDb, respectively. When sense nodes SNDa and SNDb are and electrically connected to internal data lines 907a and 907b rapidly in this state, the potentials on sense nodes SNDa and SNDb change. Sense amplifier circuit SA is required to drive the newly added parasitic capacitance Cp which is charged to the opposite data (data reverse in logic) potential. Therefore, the voltage level of the sense amplifier lowers from power supply voltage Vcc level, and accordingly the drive capability of the sense amplifier lowers. When the potentials on sense nodes SNDa and SNDb rapidly change due to the opposite data, sense amplifier circuit SA cannot hold the original data, and its latch state is inverted, so that the potential levels on bit lines BL and /BL change to H- and L-level, respectively, and the memory cell data is inverted.

In order to prevent inversion of the data which may be caused by this conflict or collision of data, change in potential level on sense nodes SNDa and SNDb of the sense amplifier must be relatively slow, and it is also necessary to keep a balance between the driving capabilities of transfer gates Ta and Tb included in I/O gate circuit 908b and the driving capabilities of MOS transistors P1–P3 and N1–N3 forming the sense amplifier. If the potentials on sense nodes SNDa and SNDb rapidly change as shown in FIG. 25, the latching state of the sense amplifier is inverted in accordance with this rapid potential change. Conversely, if the potentials on the sense nodes change slowly, the original latching state is held.

Therefore, even when the collision of data occurs due to insufficient equalizing of internal data lines 907aa and 907ab, it is necessary to prevent inversion of the latching state of the sense amplifier circuit. If the driving capability powers of transfer gates Ta and Tb are sufficiently reduced for reducing a speed of voltage change at sense nodes SNDa and SNDb, the potentials on sense nodes SNDa and SNDb change slowly in the data write operation, so that fast data writing is impossible. Also, internal data lines 907aa and 907ab cannot be driven fast in accordance with the voltages on sense nodes SNDa and SNDb, and fast data reading is impossible. In order to perform fast and stable writing and reading of data, extremely fine adjustment of sizes is required between MOS transistors P1–P3 and N1–N3 forming the sense amplifier circuit and transfer gates Ta and Tb.

In accordance with increase in storage capacity of the semiconductor memory device, components have been miniaturized, so that the semiconductor memory device must use a low operation power supply voltage for ensuring a reliability of components, reducing a power consumption and achieving a fast operation. This is because the power consumption is proportional to the square of the power supply voltage, and a smaller signal amplitude allows faster charging and discharging of a signal line.

However, MOS transistors which are components of processors in a system have not been miniaturized compared with semiconductor memory devices, and cannot employ the low power supply voltage which is required in the semiconductor memory device. The operation power supply voltage of the semiconductor memory device depends on the system power supply voltage required by the processors and others. Therefore, the semiconductor memory device employs an internal power supply voltage generating circuit, which internally lowers an externally supplied power supply voltage to a desired power supply voltage level for generating an internal power supply voltage. The circuit generating the internal power supply voltage in the above manner is called an internal voltage down converting circuit.

FIG. 26 schematically shows a whole structure of a semiconductor memory device having an internal voltage down converting circuit in the prior art. In FIG. 26, the semiconductor memory device includes an internal voltage down converting circuit 950 which receives an external power supply voltage extVcc and generates an array power supply voltage VccA (i.e., power supply voltage for an array), and an internal voltage down converting circuit 952 which receives external power supply voltage extVcc and generates a peripheral internal power supply voltage VccP (i.e., internal power supply voltage for peripheral circuitry). Internal voltage down converting circuit 950 supplies array internal power supply voltage VccA to an array-related circuit 954. Internal voltage down converting circuit 952 supplies peripheral internal power supply voltage VccP to peripheral circuitry 956. Array-related circuit 954 includes sense amplifiers. Peripheral circuitry 956 includes a read/write circuit, a row select circuit, a column select circuit and a timing control circuit. All the bit line amplitudes in the memory cell array are held at the voltage level of array internal power supply voltage VccA.

Peripheral internal power supply voltage VccP supplied to the peripheral circuit is at a higher level than array internal power supply voltage VccA. By using this relatively high internal power supply voltage VccP, the gate voltage of MOS transistors which are components of the peripheral circuitry is increased, and fast operation of peripheral circuitry 956 is allowed. For array-related circuit 954, the voltage level is kept at a slightly low level in order to ensure a reliability of a dielectric film of a memory cell capacitor, ensure a reliability of a gate insulating film of an access transistor and reducing a current consumption during operation of the sense amplifier.

Particularly in a dynamic semiconductor memory device, a boosted voltage VPP which is higher than array power supply voltage VccA and is nearly equal to 3·VccA/2 is applied onto the selected word line in order to write data of H-level into a memory cell capacitor without causing a voltage loss by a threshold voltage of an access transistor. For the above reason and for ensuring the reliability of the gate insulating film of the access transistor, the operation power supply voltage of array-related circuit 954 is set to a low value.

FIG. 27 schematically shows voltage levels applied to portions related to one bit line pair. In FIG. 27, memory cell MC is arranged corresponding to a crossing between word line WL and bit line BL. Memory cell MC includes memory cell capacitor MQ storing information, and access transistor MT which connects memory cell capacitor MQ to bit line BL in response to the potential on word line WL. A cell plate electrode node CP of memory cell capacitor MQ is supplied with intermediate voltage Vcp. Cell plate voltage Vcp is at at a level of half the array internal power supply voltage VccA. Although not shown, bit line equalize voltage Vb1 is at a level of half the array internal power supply voltage VccA.

Sense amplifier circuit SA is supplied with array internal power supply voltage VccA and ground voltage Vss as a sense amplifier power supply. Therefore, amplitudes of bit lines BL and /BL are between array internal power supply voltage VccA and ground voltage Vss. The voltage across the storage node SN and cell plate electrode node CP of memory cell capacitor MQ is equal to VccA/2, and therefore the capacitor dielectric film can have a sufficiently high insulation breakdown voltage.

The gate of access transistor MT is supplied with the boosted voltage of 3·VccA/2. However, array internal power supply voltage VccA is relatively low. Therefore, the gate insulating film of access transistor MT can reliably have desired insulating characteristics.

The column select circuit is supplied with peripheral internal power supply voltage VccP, and the peripheral circuits perform fast operations. In this case, column select signal CSL attains the voltage level equal to peripheral internal power supply voltage VccP when made active, and column select signal CSL at the voltage level of peripheral internal power supply voltage VccP is supplied to gates of transfer gates Ta and Tb included in I/O gate circuit 908b. In this case, the following problem arises.

FIG. 28 shows a relationship between a gate voltage and a drain current of an MOS transistor. The abscissa gives a drain-source voltage Vds, and the ordinate gives a drain current Ids. A curve I represents a relationship between the drain current and drain voltage in the case where the gate-source voltage is equal to a voltage Vgs1, and a curve II represents a relationship between the drain current and drain voltage in the case where the gate-source voltage is equal to a voltage Vgs2. Voltage Vgs1 is higher than voltage Vgs2.

As shown in FIG. 28, a higher gate-source voltage increases a drain current Ids if the drain voltage Vds with reference to the source is constant. More specifically, as the voltage level of column select signal CSL applied to gates of transfer gates Ta and Tb shown in FIG. 27 increases, the current driving capability of transfer gates Ta and Tb increases. Therefore, when column select signal CSL is driven to the selected state in such a state that internal data line pair 907a is equalized insufficiently as already described with reference to FIG. 25, internal data bus line pair 907a is rapidly connected to bit line pair BL and /BL and the potential change occurs due to the opposite data, resulting in a problem that the latched data of sense amplifier circuit SA is inverted.

In order to keep a balance between the sizes of transfer gate transistors Ta and Tb and the sizes of the MOS transistors included in sense amplifier circuit SA in such a case that column select signal CSL is driven to the level of peripheral internal power supply voltage VccP, it is necessary to adjust sizes of transfer gate transistors Ta and Tb and the MOS transistors included in sense amplifier circuit SA in accordance with the voltage level of peripheral internal power supply voltage VccP. Therefore, the relationship in sizes which has already been established cannot be utilized, and redesigning is required. In particular, the voltage levels of internal power supply voltages VccP and VccA have been gradually lowered in accordance with increase in integration density of the semiconductor memory devices, and cannot be set to a fixed value. Therefore, it is necessary to adjust the sizes of MOS transistors included in sense amplifier circuit SA and transfer gate transistors included in I/O gate circuit every time the internal power supply voltage level is changed. This requires a complicated design, and therefore increases a manufacturing cost.

SUMMARY OF THE INVENTION

An object of the invention is to provide a semiconductor memory device which can easily perform accurate reading of memory cell data even in such a case that internal power supply voltages at different voltage levels are employed for an array and peripheral circuitry.

Another object of the invention is to provide a semiconductor memory device which always allows fast access and accurate reading of data independently of a voltage level of an internal power supply voltage.

Briefly, the present invention provides a structure which generates a column select signal at an internal power supply voltage level for an array.

More specifically, a semiconductor memory device according to the invention includes a plurality of internal power supply circuits for generating a plurality of internal power supply voltages at different voltage levels, respectively, a memory cell array having a plurality of memory cells arranged in rows and columns, a plurality of bit line pairs arranged corresponding to the columns and connected to the memory cells in the corresponding columns, respectively, a plurality of word lines arranged corresponding to the rows and connected to the memory cells in the corresponding rows, respectively, and a plurality of sense amplifiers arranged corresponding to the plurality of bit line pairs for differentially amplifying potentials on the corresponding bit line pairs when made active, respectively. Each sense amplifier includes a circuit portion for transmitting a first internal power supply voltage produced from a first internal power supply circuit included in the plurality of internal power supply circuits to one of the corresponding paired bit lines at a higher potential when activated.

The semiconductor memory device according to the invention further includes a column select circuit for generating a column select signal selecting the addressed column among the plurality of columns in accordance with an address signal. This column select circuit includes a circuit for generating the column select signal at a level of the first internal power supply voltage.

The semiconductor memory device according to the invention further includes a column select gate for electrically coupling, in accordance with the column select signal, the bit line pair arranged corresponding to the addressed column to an internal data line pair, and peripheral circuit receiving second internal power supply voltage higher than the first internal power supply voltage as one operation power supply voltage, and performing at least an operation related to row selection for selecting a row.

The second internal power supply voltage is generated from a second internal power supply circuit included in the plurality of internal power supply circuits.

A voltage level of the column select signal applied to the column select gate for connecting the bit line pair to the internal data line pair may be equal to the level of the first internal power supply voltage level of the power supply of the sense amplifier, whereby the current driving capability of the column select gate can be small. Sizes of MOS transistors forming the sense amplifier and transfer gate transistors included in the column select gate can be adjusted to have a relationship which is established before using a circuit generating an internally down-converted internal power supply voltage, and inversion of data latched by the sense amplifier can be prevented without changing a design even when reverse data occurs on the internal data line, so that data reading can be accurately performed. Also, it is not necessary to increase an equalizing period of the internal data line, and therefore fast access is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
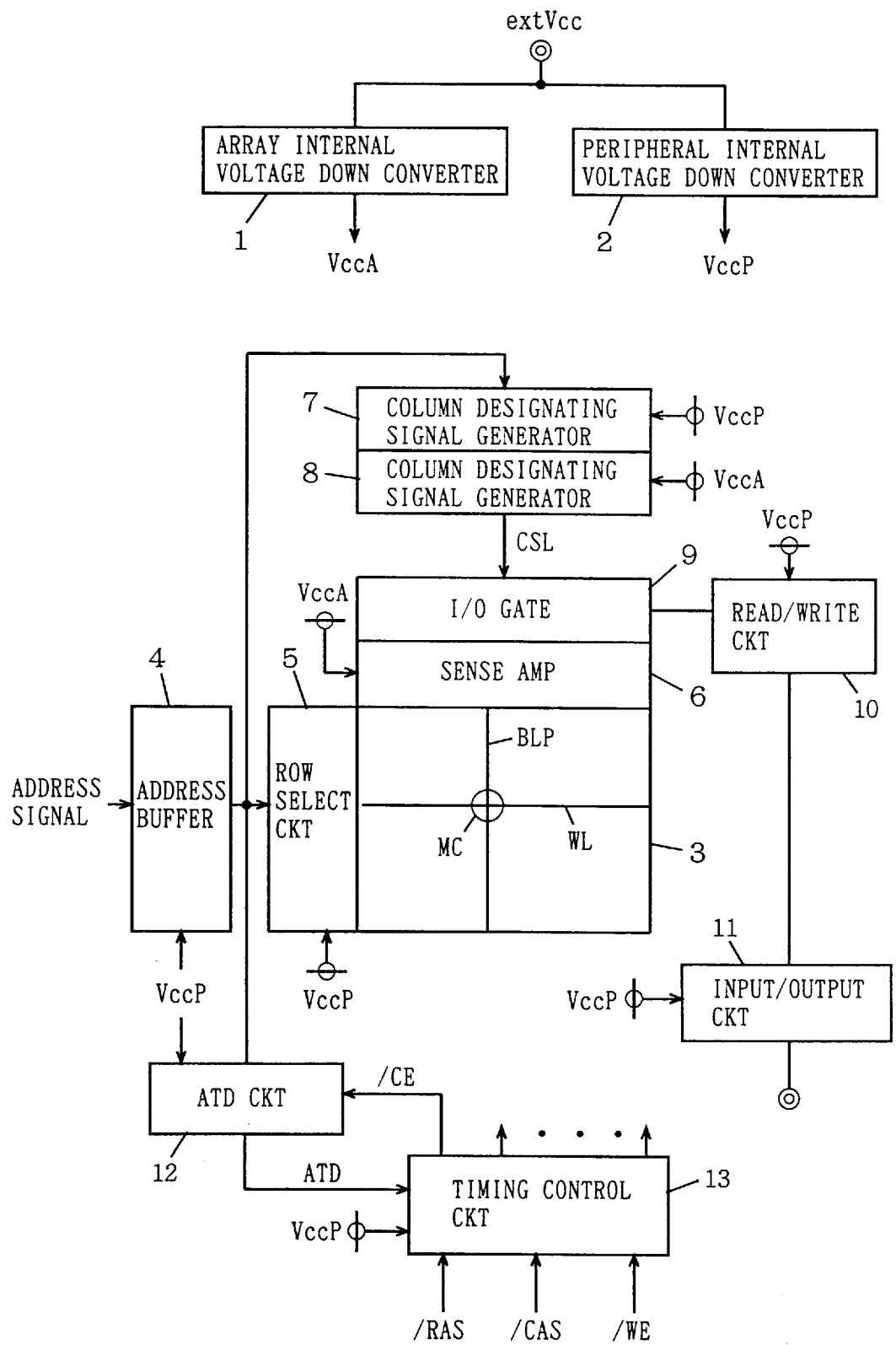
FIG. 1 schematically shows a whole structure of a semiconductor memory device according to an embodiment 1 of the invention.

FIG. 1 schematically shows a whole structure of a semiconductor memory device according to an embodiment 1 of the invention. In FIG. 1, the semiconductor memory device includes an array internal voltage down converting circuit 1 (i.e., internal voltage down converting circuit for an array) which produces array internal power supply voltage VccA (i.e., power supply voltage for an array) from external power supply voltage extvcc, and a peripheral internal voltage down converting circuit 2 (i.e., voltage down converting circuit for peripheral circuitry) which produces from external power supply voltage extVcc a peripheral internal power supply voltage VccP (i.e., internal power supply voltage for peripheral circuitry) to be applied to peripheral circuitry.

The voltage level of peripheral internal power supply voltage VccP is higher than that of array internal power supply voltage VccA. Peripheral internal voltage down converting circuit 2 may have such a structure that generates a plurality of peripheral internal power supply voltages at different voltage levels depending on functions of peripheral circuits, respectively. FIG. 1 shows, by way of example, such a structure that generates two kinds of internal power supply voltages, i.e., array internal power supply voltage VccA and peripheral internal power supply voltage VccP.

The semiconductor memory device further includes a memory cell array 3 having a plurality of memory cells MC arranged in a matrix form, an address buffer 4 which receives peripheral internal power supply voltage VccP as one operation power supply voltage thereof, and incorporates the externally applied address signal to generate an internal address signal, and a row select circuit 5 which receives peripheral internal power supply voltage VccP as one operation power supply voltage thereof, and drives the addressed row in memory cell array 3 to the selected state in accordance with the internal row address signal applied from address buffer 4.

In memory cell array 3, word lines WL are arranged corresponding to the rows of memory cells MC, respectively, and bit line pairs BLP are arranged corresponding to the columns of memory cells MC, respectively. FIG. 1 representatively shows one word line WL, one bit line pair BLP and memory cell MC arranged corresponding to the crossing thereof. Row select circuit 5 decodes an internal row address signal (complementary internal row address signals) from address buffer 4, and drives the word line corresponding to the addressed row to the selected state.

The semiconductor memory device further includes a sense amplifier 6 which receives array internal power supply voltage VccA as one operation power supply voltage thereof, and differentially amplifies the potentials on the corresponding bit line pairs BLP of memory cell array 3, respectively, a column designating signal generating circuit 7 which receives peripheral internal power supply voltage VccP as one operation power supply voltage thereof, and generates the column designating signal for designating a column in memory cell array 3 in accordance with the complementary internal column address signals applied from address buffer 4, a column select signal generating circuit 8 which receives using array internal power supply voltage VccA as one of the operation power supply voltage thereof, and generates the column select signal for selecting a column in accordance with the column designating signal from column designating signal generating circuit 7, and an I/O gate 9 which select the bit line pair corresponding to the selected column in memory cell array 3 in accordance with column select signal CSL from column select signal generating circuit 8.

Column select signal CSL at the array internal power supply voltage level is applied to I/O gate 9, whereby the gate voltage of the transfer gate transistor in an I/O gate circuit included in I/O gate 9 can be set to the same voltage level as the operation power supply voltage of each sense amplifier circuit in the sense amplifier 6, and the current driving capability of the transfer gate transistor can be reduced without requiring change in size. Also, a balance can be kept between the driving capability of the MOS transistor forming the sense amplifier circuit and the current driving capability of the transfer gate transistor included in I/O gate 9, so that inversion of the latching state of sense amplifier 6 can be prevented even when the internal data line pair is insufficiently equalized.

The semiconductor memory device further includes a read/write circuit 10 which receives peripheral internal power supply voltage VccP as one operation power supply voltage thereof, and transmits internal data to and from the bit line pair selected by I/O gate 9, and an I/O circuit 11 which receives peripheral internal power supply voltage VccP as one operation power supply voltage thereof, and performs transmission of external data to and from read/write circuit 10. External power supply voltage extvcc may be applied as an operation power supply voltage of the last stage of the output circuit of I/O circuit 11 (i.e., output buffer stage connected to an external terminal).

Figure 20:
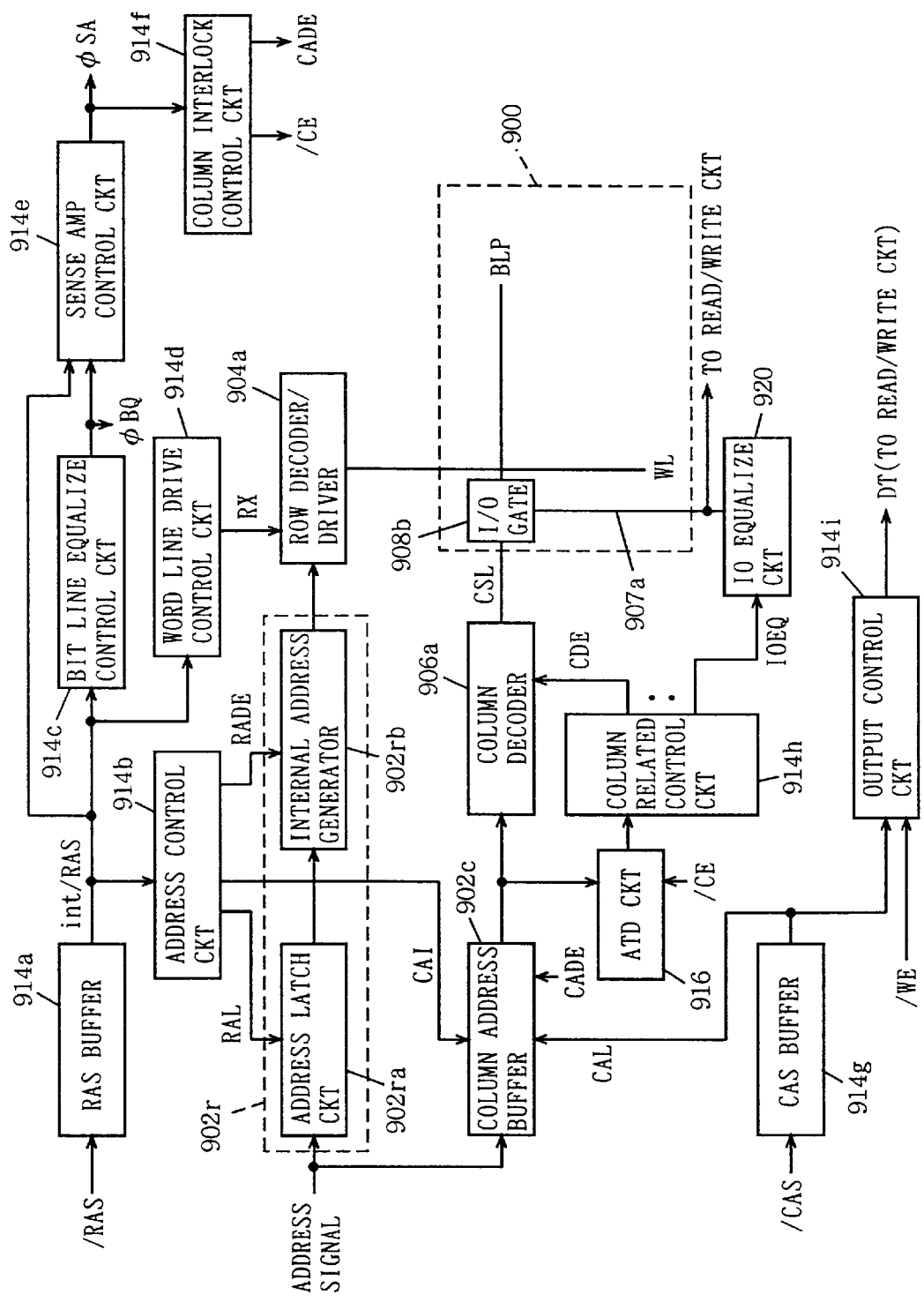
FIG. 20 schematically shows a structure of peripheral circuitry of the semiconductor memory device in the prior art.
Figure 21:
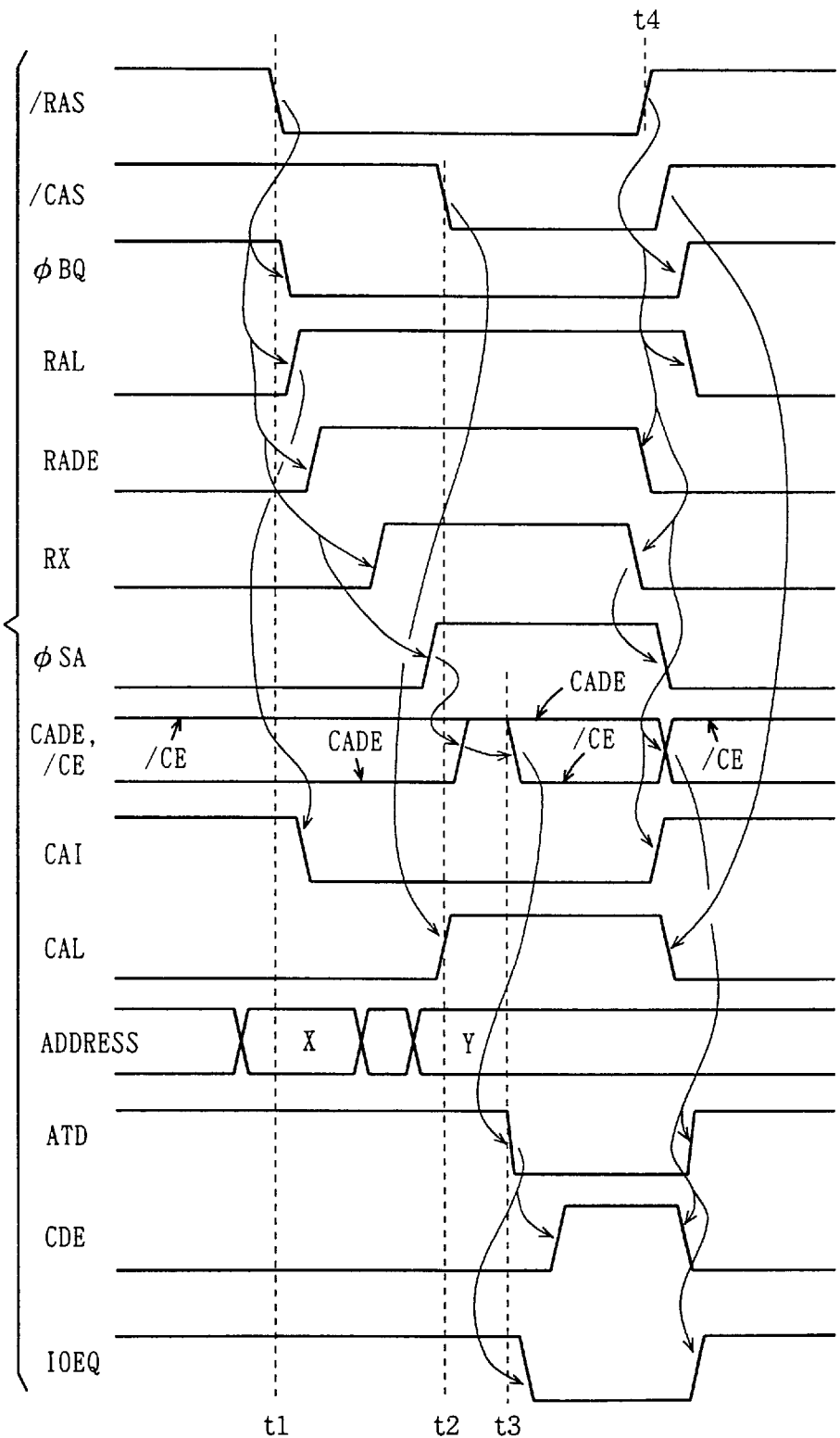
FIGS. 21 and 22 are signal waveform diagrams representing operations of the peripheral circuits shown in FIG. 20.
Figure 22:
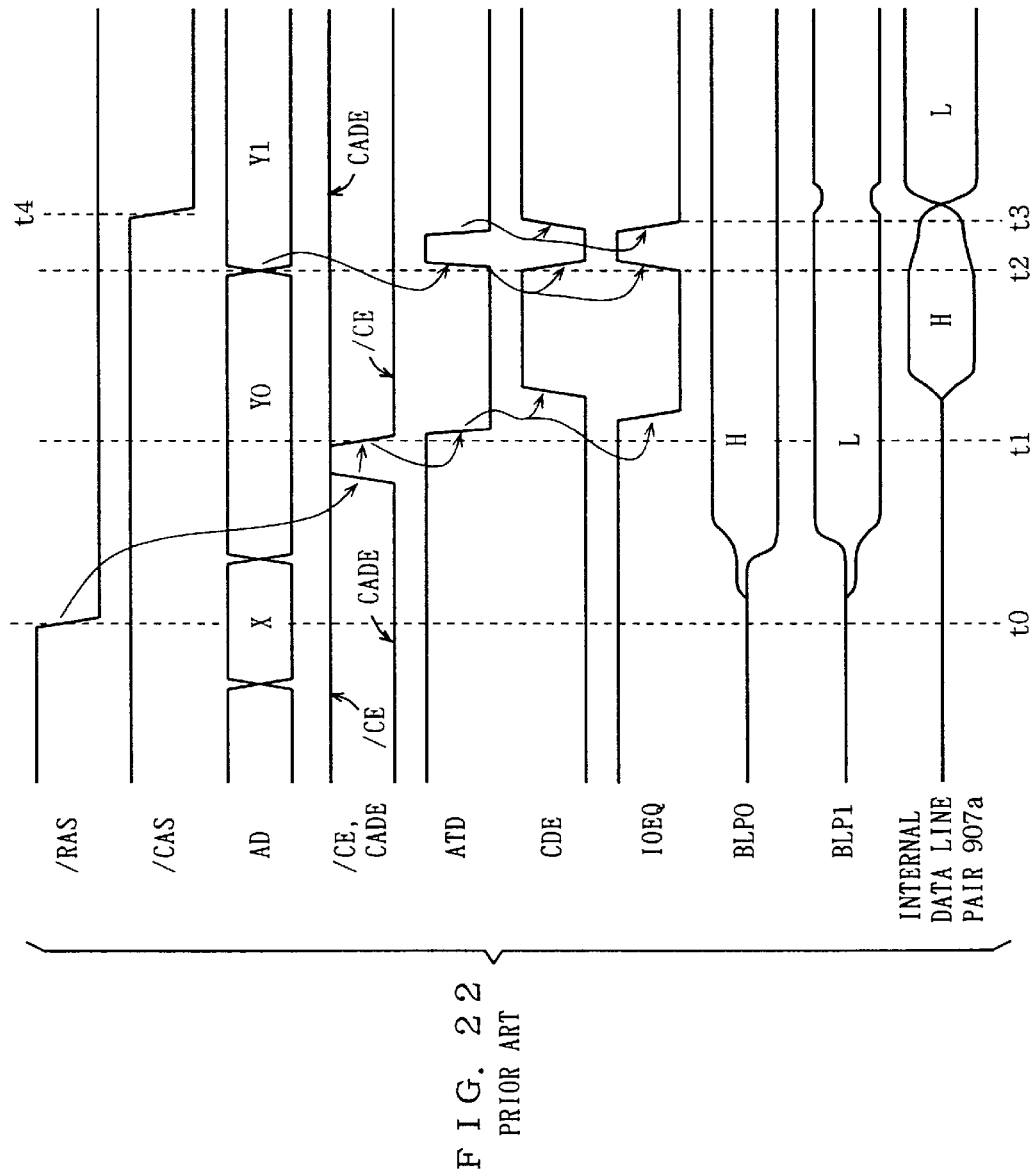
Figure 23:
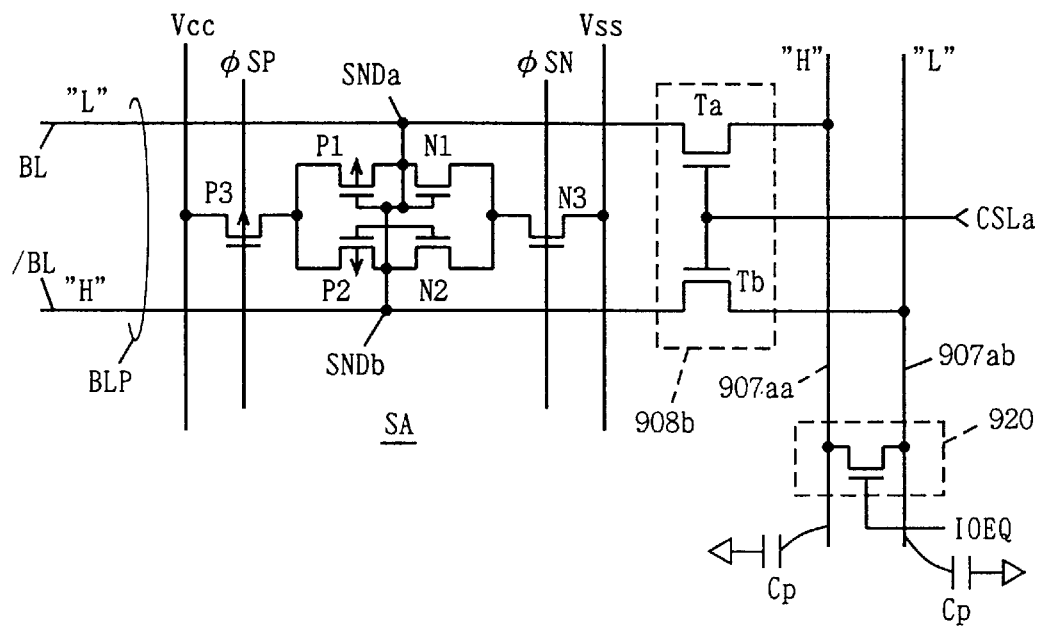
FIG. 23 schematically shows a structure including a sense amplifier portion and a column select gate portion in the conventional semiconductor memory device.
Figure 24:
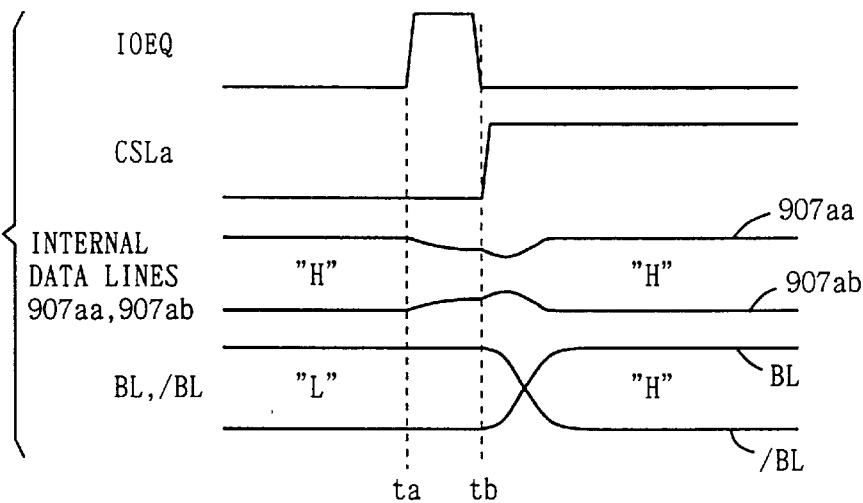
FIG. 24 is a signal waveform diagram representing an operation of the structure shown in FIG. 23.
Figure 25:
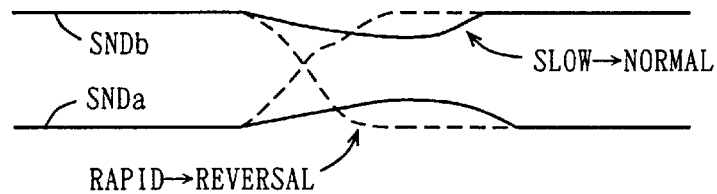
FIG. 25 illustrates a problem of the structure shown in FIG. 23.
Figure 26:
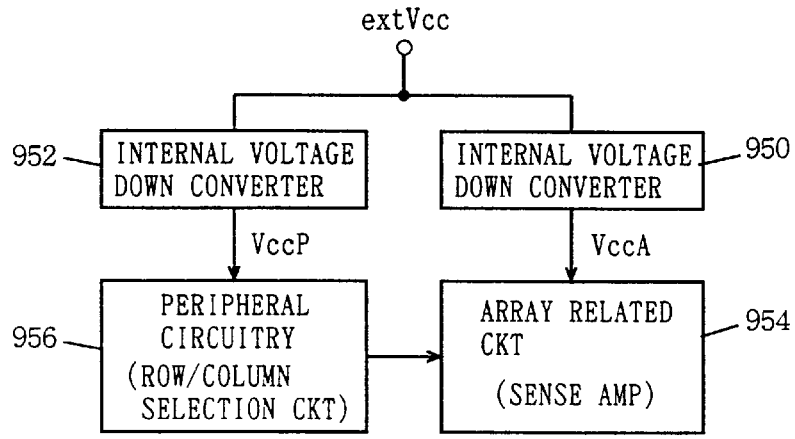
FIG. 26 schematically shows a whole structure of the semiconductor memory device in the prior art.
Figure 27:
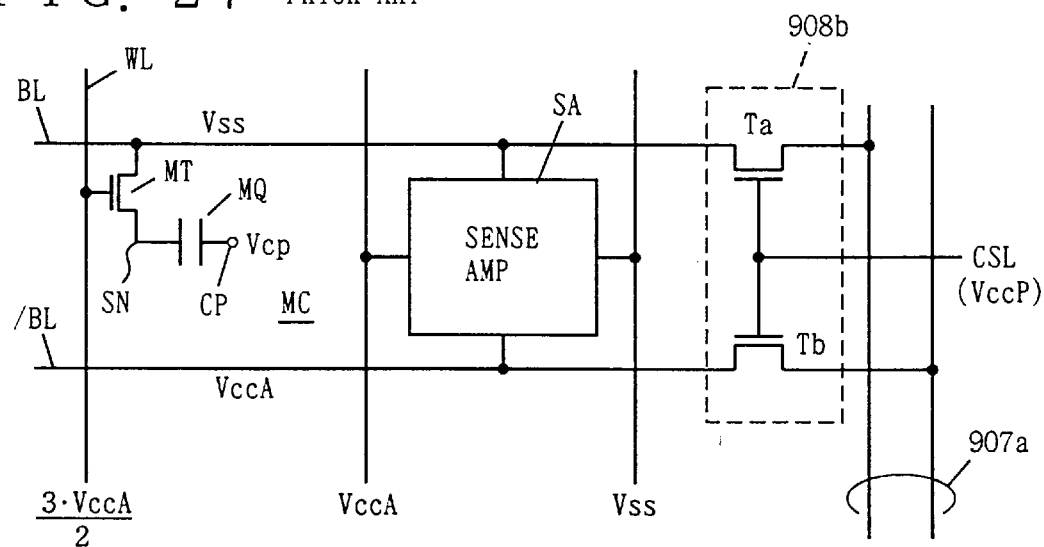
FIG. 27 schematically shows a structure of an array and applied voltages in the structure shown in FIG. 26.
Figure 28:
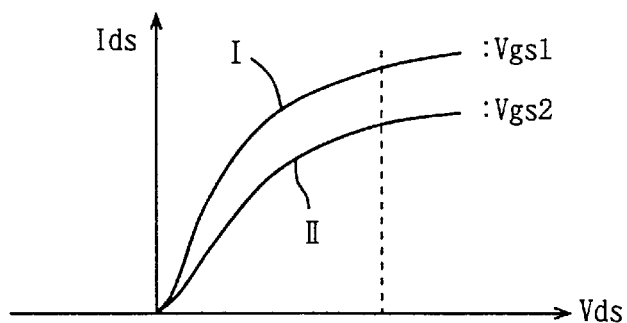
FIG. 28 schematically shows a relationship between a gate voltage and a drain current of an MOS transistor.

This semiconductor memory device further includes a timing control circuit 13 which receives peripheral internal power supply voltage VccP as one operation power supply voltage thereof, and receives externally applied row address strobe signal /RAS, column address strobe signal /CAS and write enable signal /WE to generate internal control signals, and an ATD circuit 12 which receives peripheral internal power supply voltage VccP as one operation power supply voltage thereof, and detects a transition in the internal column address signal applied from address buffer 4. Address transition detection signal ATD from ATD circuit 12 is applied to a timing control circuit 13. ATD circuit 12 is made active when column enable signal /CE is active. An internal structure of timing control circuit 13 is the same as that shown in FIG. 20, and each circuit included therein receives peripheral internal power supply voltage VccP as one operation power supply voltage thereof. A word line drive control circuit 914*d* shown in FIG. 20 generates boosted voltage VPP based on array internal power supply voltage VccA, and drives word line drive signal RX to the boosted voltage level.

Figure 2:
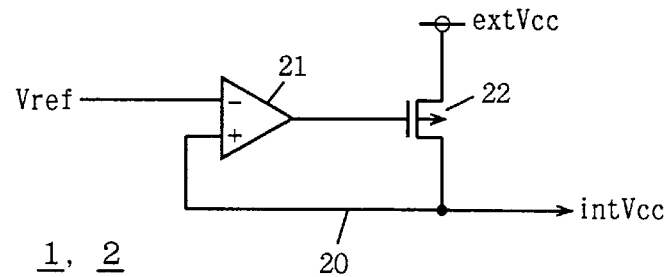
FIG. 2 shows an example of a structure of an internal voltage down converting circuit shown in FIG. 1.

FIG. 2 shows an example of a structure including internal voltage down converting circuits 1 and 2 shown in FIG. 1. Since array internal voltage down converting circuit 1 and peripheral internal voltage down converting circuit 2 have the substantially same circuit structure, the structure of only one of the internal voltage down converting circuits is representatively shown in FIG. 2.

In FIG. 2, the internal voltage down converting circuit includes a differential amplifier 21 which differentially amplifies a reference voltage Vref and an internal power supply voltage intVcc on an internal power supply line 20, and a current drive transistor 22 formed of a p-channel MOS transistor which is connected between an external power supply node and internal power supply line 20, and supplies a current from the external power supply node to internal power supply line 20 in accordance with the output signal of differential amplifier 21.

When internal power supply voltage intVcc is higher than reference voltage Vref, the output signal of differential amplifier 21 is at H-level, and current drive transistor 22 is off. When internal power supply voltage intVcc is lower than reference voltage Vref, the output signal of differential amplifier 21 is at a low level corresponding to the difference between them, and a conductance of current drive transistor 22 increases, so that a current is supplied from the external power supply node to the internal power supply line 20. Therefore, internal power supply voltage intVcc is held substantially at the voltage level of reference voltage Vref. By setting the voltage level of reference voltage Vref to an appropriate value, array internal power supply voltage VccA and peripheral internal power supply voltage VccP can be generated as internal power supply voltages intVcc at different voltage levels.

Figure 3:
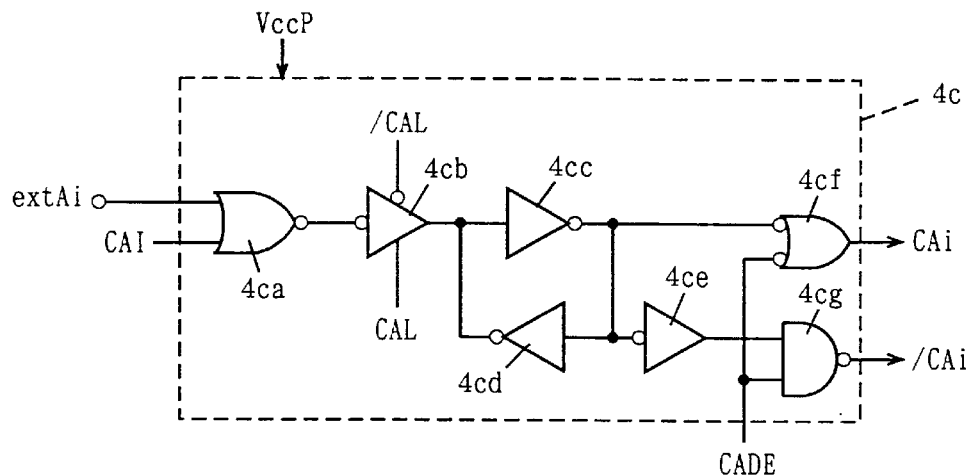
FIG. 3 shows an example of a structure of an address buffer shown in FIG. 1.

FIG. 3 shows an example of the structure of the column address buffer in FIG. 1. In FIG. 3, column address buffer 4*c* receives peripheral internal power supply voltage VccP as one operation power supply voltage thereof. FIG. 3 representatively shows the column address buffer circuit provided corresponding to the address signal of 1 bit.

Referring to FIG. 3, column address buffer 4*c* has an NOR circuit 4*ca* which receives an externally supplied address signal bit extAi and column inhibiting signal CAI, a tristate inverter buffer 4*cb* which inverts and passes an output signal of NOR circuit 4*ca* in accordance with column address latch instructing signals CAL and /CAL, an inverter circuit 4*ca* which inverts an output signal of tristate inverter buffer 4*cc*, an inverter circuit 4*cb* which inverts an output signal of inverter circuit 4*cc* for transmission to an input of inverter circuit 4*cc*, an inverter circuit 4*ce* which inverts the output signal of inverter circuit 4*cc*, an NAND circuit 4*cf* which receives the output signal of inverter circuit 4*cc* and column address enable signal CADE, and an NAND circuit 4*cd* which receives an output signal of inverter circuit 4*ce* and column address enable signal CADE. NAND circuit 4*cf* generates internal a column address signal bit CAi, and NAND circuit 4*cd* generates a complemental internal column address signal bit /CAi. An operation will be briefly described below.

When row address strobe signal /RAS is at H-level, column address inhibiting signal CAI is at H-level, and the output signal of NOR circuit 4*ca* is fixed to L-level. Tristate inverter buffer 4*cb* is active to invert the output signal of NOR circuit 4*ca* for transmission when column address latch instructing signal CAL is at H-level. When row address strobe signal /RAS is activated, the row address signal is internally taken in. Thereafter, column address inhibiting signal CAI attains L-level, and NOR circuit 4*ca* acts as an inverter to invert the external address signal bit extCAi for outputting. When column address latch instructing signal CAL is at H-level, tristate inverter buffer 4*cb* further inverts and transmits the output signal of NOR circuit 4*ca*. The output signal of tristate inverter buffer 4*cb* is latched by a latch circuit formed of inverter circuits 4*cc* and 4*cd*.

When column address enable signal CADE is at L-level, both address signal bits CAi and /CAi generated from NAND circuit 4*cf* and 4*cg* are at H-level, and complementary internal column address signal bits are not produced. When column address enable signal CADE is at L-level, NAND circuits 4*cf* and 4*cg* act as inverters, so that internal column address signal bits CAi and /CAi generated in this state correspond to the address signal bits latched by inverter circuits 4*cc* and 4*cd*, respectively. When column address latch instructing signal CAL attains L-level, tristate inverter buffer 4*cb* attains an output high impedance state, and take-in of external address signal bit extAi is inhibited.

In the structure of the column address buffer shown in FIG. 3, complementary internal column address signal bits CAi and /CAi are generated in accordance with external address signal bit extAi while column address strobe signal /CAS is at H-level after row address strobe signal /RAS is activated to attain L-level and column enable signal /CE is activated to attain L-level. Thereby, the address transition is detected.

When the column address buffer and row address strobe signal /RAS are activated, and column address inhibiting signal CAI is set to the inactive state of L-level, incorporation of externally supplied address signal bit extAi is allowed. Therefore, internal column address signal bits CAi and /CAi change in accordance with external address signal bit extAi until column address latch signal CAL is set to the state instructing the latch in accordance with activation of the column address strobe signal /CAS (only after column address enable signal CADE is activated upon elapsing of the column interlock period).

In the case where column address strobe signal /CAS is activated after elapsing of the column interlock period, therefore, the column-related circuits internally perform column-related operations in accordance with the address transition signal, and the internal data line pair is also equalized. As already described, however, the data inversion is prevented by setting the voltage level of column select signal CSL to the internal power supply voltage level for the array.

Figure 4:
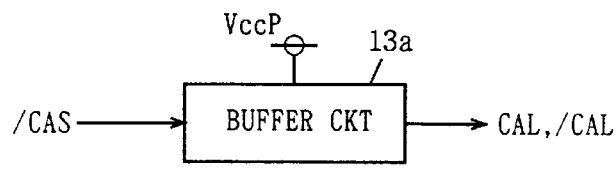
FIG. 4 schematically shows a structure of a column address latch instructing signal generating portion included in a timing control circuit shown in FIG. 1.

FIG. 4 schematically shows a structure of a portion generating column address latch instructing signals CAL and /CAL shown in FIG. 3. In FIG. 4, the column address latch instructing signal generating portion includes a buffer circuit 13a which receives and buffers externally applied column address strobe signal /CAS. Buffer circuit 13a is included in timing control circuit 13 shown in FIG. 1, and receiving peripheral internal power supply voltage VccP as one operation power supply voltage thereof. As shown in FIG. 4, column address latch instructing signals CAL and /CAL are generated in synchronization with column address strobe signal /CAS.

Figure 5:
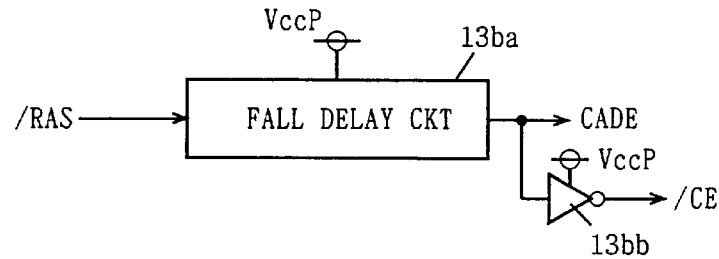
FIG. 5 schematically shows a structure of a column-related operation enable signal generating portion included in the timing control circuit shown in FIG. 1.

FIG. 5 shows a structure of the portion generating column address enable signal CADE shown in FIG. 3. Column address enable signal CADE and column enable signal /CE are generated from a fall delay circuit 13ba and an inverter 13bb, respectively, each of which receives peripheral internal power supply voltage VccP as one operation power supply voltage thereof. Fall delay circuit 13ba delays a fall of row address strobe signal /RAS by a predetermined time. Inverter 13bb receives an output signal of fall delay circuit 13ba. Fall delay circuit 13ba and inverter 13bb are included in timing control circuit 13 shown in FIG. 1. When a predetermined time elapses after the sense amplifier is activated in accordance with activation of row address strobe signal /RAS, column address enable signal CADE is first activated, and then column enable signal /CE is activated, so that the column-related operation is allowed.

Figure 6:
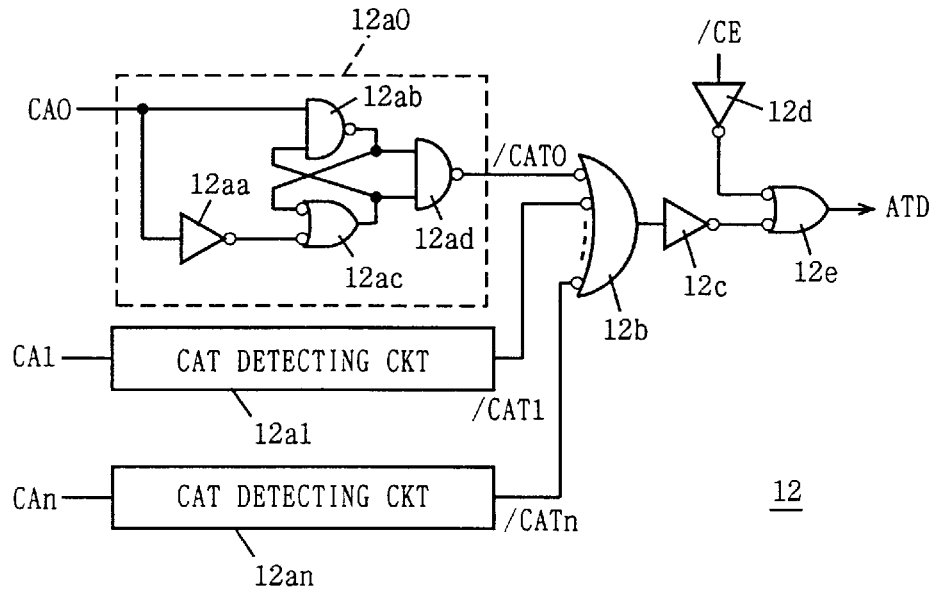
FIG. 6 shows an example of a structure of an ATD circuit shown in FIG. 1.
Figure 12:
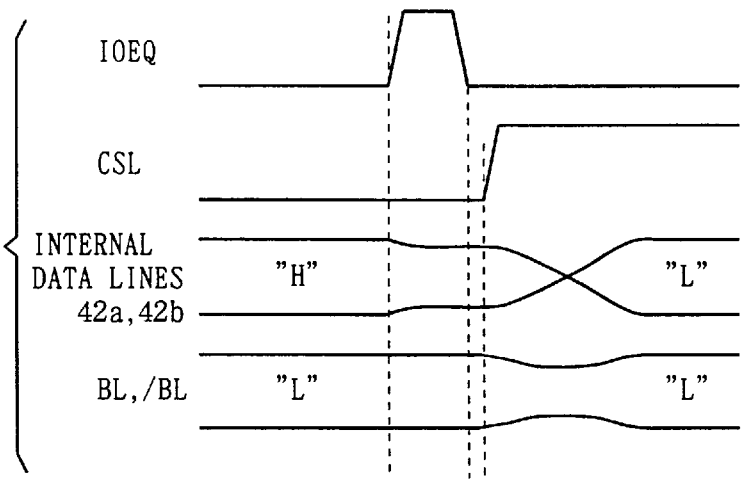
FIG. 12 is a signal waveform diagram representing an operation of the structure shown in FIG. 11.

FIG. 6 shows an example of a structure of ATD circuit 12 shown in FIG. 1. In FIG. 12, CAT detecting circuits 12a0–12an are arranged corresponding to column address signal bits CA0–CAn from column address buffer 4c for detecting transitions therein, respectively. Each of CAT detecting circuits 12a0–12an receives peripheral internal power supply voltage VccP as one operation power supply voltage thereof. CAT detecting circuits 12a0–12an have the same internal structure. FIG. 6 representatively shows the structure of CAT detecting circuit 12a0 provided for column address signal bit CA0.

CAT detecting circuit 12a0 includes an inverter circuit 12aa receiving column address signal bit CA0, an NAND circuit 12ab receiving column address signal bit CA0 at one input thereof, an NAND circuit 12ac receiving at one input an output signal of inverter circuit 12aa, and an NAND circuit 12ad receiving output signals of NAND circuits 12ab and 12ac. The outputs and the other inputs of NAND circuits 12ab and 12ac are cross-coupled to each other. NAND circuit 12ad generates a transition detection signal /CAT0.

ATD circuit 12 further includes an NAND circuit 12b which receives output signals /CAT0–/CATn of CAT detecting circuits 12a0–12an, an inverter circuit 12c receiving an output signal of NAND circuit 12b, an inverter circuit 12d receiving column enable signal /CE, and an NAND circuit 12e receiving output signals of inverter circuits 12c and 12d. NAND circuit 12e generates address transition detection signal ATD. An operation will be briefly described below.

When column address signal bit CA0 is at L-level, the output signal of NAND circuit 12ab is at H-level, and the output signal of NAND circuit 12ac is at L-level, so that the output signal of NAND circuit 12ad is at H-level.

When column address signal bit CA0 rises to H-level, the output signal of inverter circuit 12aa falls to L-level after elapsing of a delay time determined by inverter circuit 12aa. After a delay time determined by NAND circuit 12ac elapses the output signal of NAND circuit 12ac rises to H-level in accordance with falling of the output signal of inverter circuit 12aa. Thereby, the output signal of NAND circuit 12ad falls to L-level after a gate delay time determined by NAND circuit 12ab elapses. During the gate delay time of NAND circuit 12ab, therefore, both the output signals of NAND circuits 12ab and 12ac are at H-level, and CAT detection signal /CAT0 generated from NAND circuit 12ad falls to L-level.

When column address signal bit CA0 falls from H-level to L-level, the output signal of NAND circuit 12ab rises to H-level after elapsing of the gate delay time of NAND circuit 12ab. After the gate delay time of inverter circuit 12aa and the gate delay time of NAND circuit 12ac elapse, the output signal of NAND circuit 12ac falls from H-level to L-level. In this case, therefore, signals on both the inputs of NAND circuit 12ad attain H-level, and the output signal /CAT0 falls to L-level.

At either of times when column address signal bit CA0 changes from L-level to H-level and vice versa, transition detection signal /CAT0 is set to the active state of L-level. The active period of the CAT detection signal is set based on the gate delay times of NAND circuits 12ab and 12ac and inverter 12aa.

NAND circuit 12b receives output signals /CAT0–/CATn of CAT detecting circuits 12a0–12an. Therefore, when a change occurs even in one bit, the output signal of NAND circuit 12b attains H-level, so that the output signal of inverter circuit 12c attains L-level. When column enable signal /CE is in the inactive state of H-level, the address transition detection signal ATD from NAND circuit 12e is at H-level. When column enable signal /CE is activated to attain L-level, the output signal of inverter 12d attains H-level, so that NAND circuit 12e operates as an inverter, and address transition detection signal ATD is activated at each time of change in the column address in accordance with the output signal of inverter circuit 12c, and will be at H-level for a predetermined period. ATD circuit 12 also utilizes peripheral internal power supply voltage VccP as one operation power supply voltage thereof.

Figure 7:
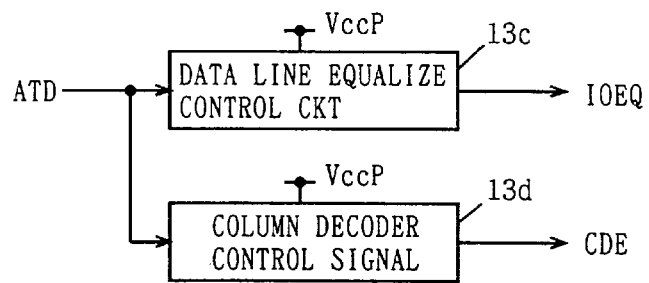
FIG. 7 schematically shows a structure including a data line equalize circuit and a column decoder enable circuit portion included in the timing control circuit shown in FIG. 1.

FIG. 7 schematically shows a structure of a portion generating internal data line equalize signal IOEQ and column decoder enable signal CDE. In FIG. 7, internal data line equalize signal IOEQ is generated from data line equalize control circuit 13c, which operates in response to address transition detection signal ATD, receiving peripheral internal power supply voltage VccP as one operation power supply voltage thereof. Column decoder enable signal CDE is generated from column decoder control circuit 13d, which operates in response to address transition detection signal ATD, receiving peripheral internal power supply voltage VccP as one operation power supply voltage thereof. Internal data line equalize signal IOEQ is deactivated to attain L-level in response to falling (deactivation) of address transition detection signal ATD, and is activated in response to rising (activation) of address transition detection signal ATD.

Column decoder enable signal CDE is activated in response to deactivation of address change detection signal ATD, and is deactivated in response to activation of address transition detection signal ATD.

Figure 8:
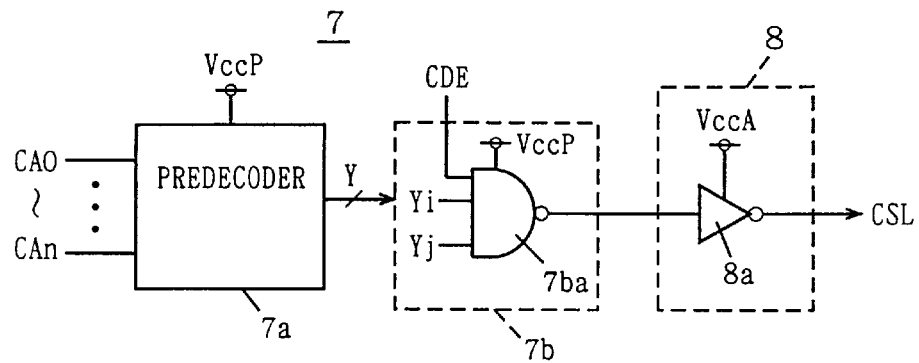
FIG. 8 schematically shows a structure including a column designating signal generating circuit and a column select signal generating circuit shown in FIG. 1.

FIG. 8 schematically shows a structure including column designating signal generating circuit 7 and column select signal generating circuit 8 shown in FIG. 1. In FIG. 8, column designating signal generating circuit 7 includes a predecoder 7a which receives peripheral internal power supply voltage VccP as one operation power supply voltage thereof, and decodes address signal bits CA0–CAn and /CA0–/CAn from the column address buffer for a predecode signal Y, and a decode circuit 7b which receives peripheral internal power supply voltage VccP as one operation power supply voltage thereof, is activated in response to activation of column decoder enable signal CDE, and decodes predecode signal Y from predecoder 7a for generating the column designating signal. FIG. 8 representatively shows a NAND circuit 7ba which is provided corresponding to one column select signal.

NAND circuit 7ba receives peripheral internal power supply voltage VccP as one operation power supply voltage thereof, and is activated to decode predecode signals Yi and Yj when column decoder enable signal CDE is active. The column designating signal from decode circuit 7b is at the voltage level of peripheral internal power supply voltage VccP when selected.

Column select signal generating circuit 8 receives array internal power supply voltage VccA as one operation power supply voltage thereof, and buffers the column designating signal from decode circuit 7b for outputting. FIG. 8 representatively shows an inverter circuit 8a for generating column select signal CSL. Inverter circuit 8a inverts the column designating signal from NAND circuit 7ba, and sets the voltage level thereof to the voltage level of array internal power supply voltage VccA.

NAND circuit 7ba generates a signal at the ground voltage level when selected. In this state, column select signal generating circuit 8 generates column select signal CSL at the level of array internal power supply voltage VccA. When the output signal of NAND circuit 7ba is at the voltage level of peripheral power supply voltage VccP, column select signal CSL generated from inverter circuit 8a, which is included in this column select signal generating circuit 8, is at the ground voltage level. Inverter circuit 8a is formed of CMOS transistors, and a p-channel MOS transistor provided therein is reliably turned off when it receives a signal at the level of peripheral internal power supply voltage VccP. Therefore, even in the case that the voltage level of operation power supply voltage VccP of column designating signal generating circuit 7 is different from that of operation power supply voltage VccA of column select signal generating circuit 8, the column select signal at the voltage level of array internal power supply voltage VccA can be reliably produced without requiring another level converting circuit for converting a voltage level, because peripheral power supply voltage VccP is higher than array internal power supply voltage VccA.

Figure 9:
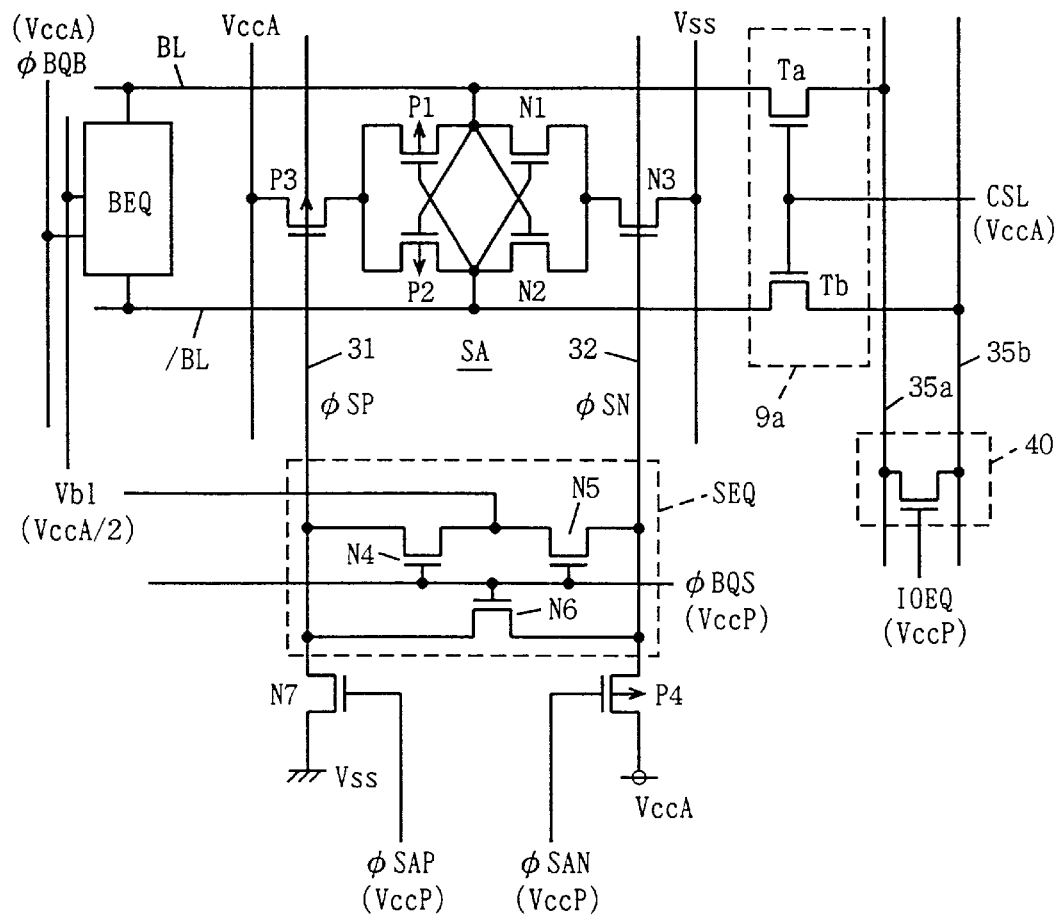
FIG. 9 shows a structure of an array in the semiconductor memory device shown in FIG. 1 and levels of applied voltages.

FIG. 9 shows a structure of a portion related to one sense amplifier circuit SA. In FIG. 9, sense amplifier circuit SA includes cross-coupled p-channel MOS transistors P1 and P2, a p-channel MOS transistor P3 which transmits array internal power supply voltage VccA to sources of MOS transistors P1 and P2 in response to activation of sense amplifier activating signal φSP, n-channel MOS transistors N1 and N2 having drains and gates cross-coupled, and an n-channel MOS transistor N3 which is turned on to transmit ground voltage Vss to sources of MOS transistors N1 and N2 in response to activation of sense amplifier activating signal φSN.

A sense amplifier equalize circuit SEQ is provided for signal lines 31 and 32 which transmit sense amplifier activating signals φSP and φSN, respectively. Sense amplifier equalize circuit SEQ includes n-channel MOS transistors N4 and N5 which are turned on to transmit intermediate voltage Vb1 (=VccA/2) to signal lines 31 and 32, respectively in response to a sense equalize instructing signal φBQS, and an n-channel MOS transistor N6 which is turned on to electrically short-circuit signal lines 31 and 32 in response to activation of sense equalize instructing signal φBQS.

For signal lines 31 and 32, there are provided an n-channel MOS transistor N7 which is turned on to transmit ground voltage Vss onto signal line 31 in response to activation of a sense amplifier drive signal φSAP, and a p-channel MOS transistor P4 which is turned on to transmit array internal power supply voltage VccA onto signal line 32 in response to activation of a sense amplifier drive signal φSAN. Sense amplifier drive signals φSAP and φSAN have amplitudes of peripheral internal power supply voltage VccP. Sense amplifier drive signals φSAP and φSAN are precharged to the voltage level of intermediate voltage Vb1 (=VccA/2) when made inactive.

For bit lines BL and /BL, there is provided a bit line equalize circuit BEQ which is turned on to transmit intermediate voltage Vb1 (=VccA/2) onto bit lines BL and /BL in response to activation of bit line equalize instructing signal φBQB. Bit line equalize circuit BEQ has the same structure as sense amplifier equalize circuit SEQ. Bit line equalize instructing signal φBQB is at the voltage level of array internal power supply voltage VccA. For ensuring intended voltage characteristics of the MOS transistors in the array, the voltage level of bit line equalize instructing signal φBQB is held at the voltage level of array internal power supply voltage VccA when made active.

For bit lines BL and /BL, there is provided an I/O gate circuit 9a, which is turned on to connect bit lines BL and /BL to internal data lines 35a and 35b, respectively in response to column select signal CSL. I/O gate circuit 9a includes transfer gate transistors Ta and Tb which are formed of n-channel MOS transistors receiving column select signal CSL on their gates.

For internal data lines 35a and 35b, there is provided an equalize circuit 40 which is turned on to equalize the potential of internal data lines 35a and 35b. Equalize instructing signal IOEQ is at the voltage level of peripheral internal power supply voltage VccP.

As shown in FIG. 9, transfer gate transistors Ta and Tb of I/O gate circuit 9a receive on their gates column select signal CSL at the voltage level of array internal power supply voltage VccA. MOS transistors P1–P3 and N1–N3 forming sense amplifier circuit SA receive on their gates the voltage level of array internal power supply voltage VccA at highest when active. Therefore, a balance between the current driving capabilities of these MOS transistors P1–P3 and N1–N3 and the current driving capabilities of transfer gate transistors Ta and Tb can be kept without complicated size adjustment, and it is possible to suppress rapid potential change at sense nodes (bit lines BL and /BL) of sense amplifier circuit SA even when collision of data occurs due to insufficient equalization of internal data lines 35a and 35b. Therefore, inversion of latched data of sense amplifier circuit SA does not occur.

This is because transfer gate transistors Ta and Tb receive on their gates the voltage at a level of array internal power supply voltage VccA, and their current driving capabilities can be made smaller than those in the case where they are supplied with peripheral internal power supply voltage VccP. The relationship, which is established with respect to the sizes of the MOS transistors forming the sense amplifier circuit and the transfer gate transistors forming the I/O gate circuit, can be made similar to that in the case where the power supply voltage at the lowered level is commonly supplied to the circuitry for array and to the peripheral circuitry, similarly to the prior art. Therefore, the internal power supply voltages can be set to optimum voltage levels without requiring design change (see FIG. 10).

Figure 10:
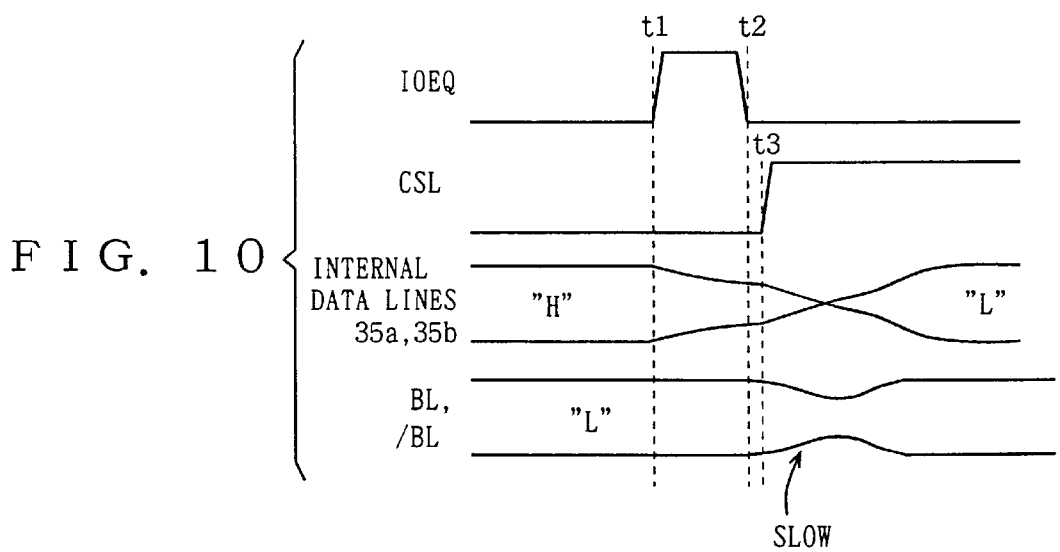
FIG. 10 is a signal waveform diagram representing an operation of the semiconductor memory device shown in FIG. 9.

More specifically, as shown in FIG. 10, the active period of internal data line equalize instructing signal IOEQ is short, so that the signal potentials of data on internal data lines 35a and 35b are insufficiently equalized. Even when column select signal CSL rises to the selected state at time t3, the current driving capabilities of transfer gate transistors Ta and Tb are relatively small and similar to the current driving capabilities of the MOS transistors forming sense amplifier circuit SA. Even upon connection to the internal data lines bearing reverse data, potential change occurs slowly on bit lines BL and /BL, and inversion of the latched data of sense amplifier circuit SA, which may be caused by the reverse data on the internal data lines, is prevented. Therefore, the data held by the sense amplifier circuit SA is reliably transmitted onto internal data lines 35a and 35b.

In the structure shown in FIG. 9, both sense amplifier equalize instructing signal φBQS and bit line equalize instructing signal φBQB may be set to the voltage level of peripheral internal power supply voltage VccP, and alternatively may be set to the voltage level of array internal power supply voltage VccA. Also, these signals may be the same.

[Modification]

Figure 11:
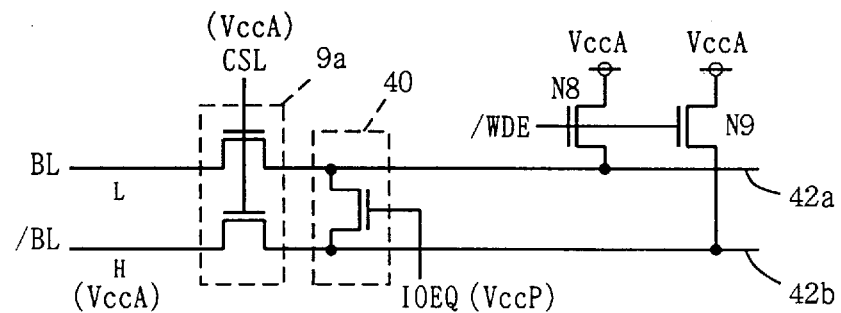
FIG. 11 schematically shows a structure of a main portion of a modification of the embodiment 1 of the invention.

FIG. 11 schematically shows a structure of a modification of the embodiment 1 of the invention. The structure shown in FIG. 11 is provided with pull-up transistors N8 and N9 for internal data lines 42a and 42b, respectively. Pull-up transistors N8 and N9 are turned on in response to an inverted signal /WDE of the write instructing signal generated in response to the write enable signal /WE. Thus, pull-up transistors N8 and N9 are off only when data writing is to be performed. When turned on, pull-up transistors N8 and N9 pull up internal data lines 42a and 42b to the voltage level of (VccA−Vth) where Vth presents a threshold voltage of pull-up transistors N8 and N9, respectively.

For internal data lines 42a and 42b, there is provided equalize circuit 40 which equalizes internal data lines 42a and 42b in response to equalize instructing signal IOEQ at the level of peripheral internal power supply voltage VccP. Equalize circuit 40 in FIG. 11 is the same as that shown in FIG. 9.

I/O gate circuit 9a which is turned on in response to activation of column select signal CSL is arranged between internal data lines 42a and 42b and bit lines BL and /BL. Column select signal CSL is at the voltage level of array internal power supply voltage VccA.

In connection with the structure shown in FIG. 11, description will now be given on such a case that equalize instructing signal IOEQ is active only for a short period from time t0 to time t1, voltages of internal data lines 42a and 42b are not sufficiently equalized, and column select signal CSL rises to H-level at time t3. In the state shown in FIG. 12, a voltage at L-level is read onto bit line BL, and bit line /BL is at the voltage level of array internal power supply voltage VccA. Even in this case, column select signal CSL is at the voltage level of array internal power supply voltage VccA, the current driving capability is smaller than that in the case that peripheral internal power supply voltage VccP is supplied, and internal data lines 42a and 42b can be driven to the voltage levels corresponding to the voltage levels of bit lines BL and /BL without inversion of the voltage levels of bit lines BL and /BL, respectively.

In FIG. 12, however, the L-level is higher than the ground voltage level owing to provision of pull-up transistors N8 and N9, and the signal amplitudes of internal data lines 42a and 42b during data reading are smaller than those during data writing.

According to the embodiment 1 of the invention, as described above, the voltage level of the column select signal, which is applied to the I/O gate circuit provided for connecting the bit line pair to the internal data line pair, is set to the same voltage level as the array internal power supply voltage, i.e., sense amplifier operation power supply voltage, so that a balance is kept between the current driving capability of the I/O gate circuit and the current driving capability of the sense amplifier circuit. Therefore, even in the case that collision of data occurs due to insufficient equalizing of the voltages on the internal data line pair, data reading can be performed accurately without inversion of the voltage on the bit line held by the sense amplifier. In this case, it is not necessary to lengthen the internal data line equalize period, and therefore data reading can be performed accurately without impairing the fast accessibility.

Embodiment 2

Figure 13:
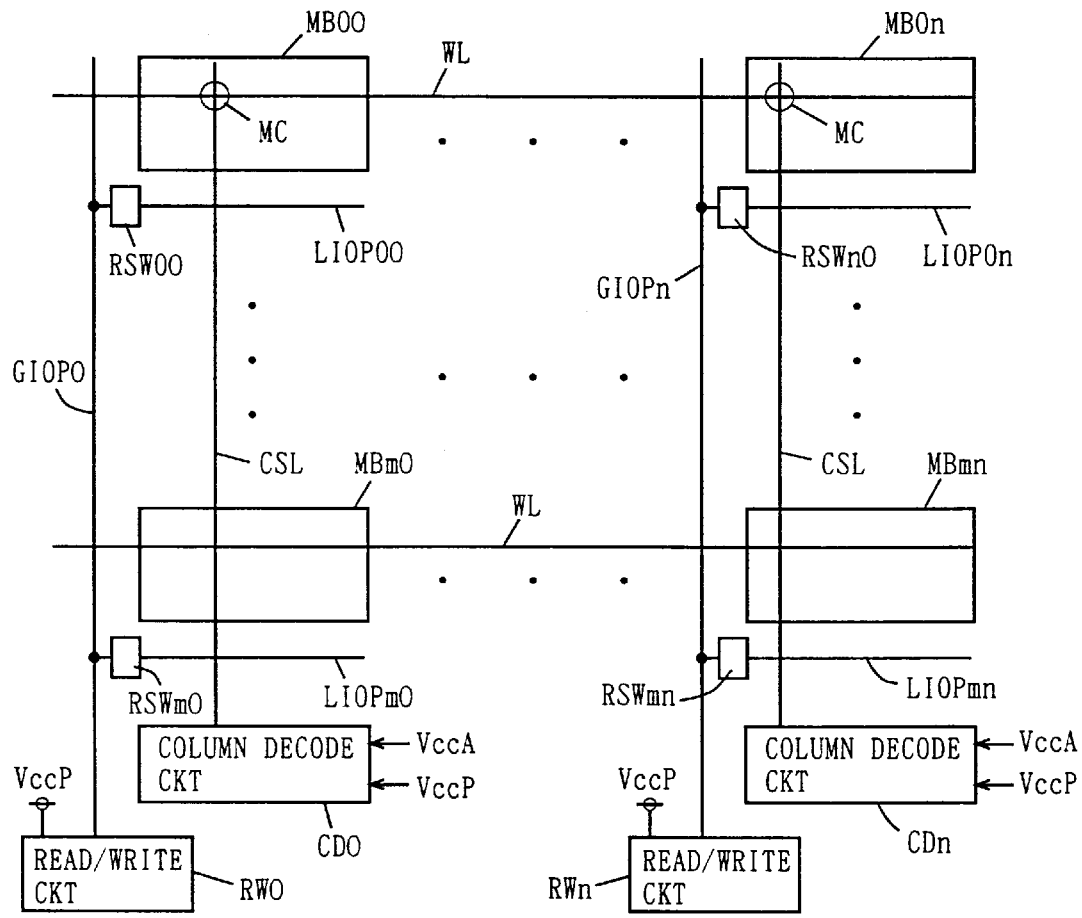
FIG. 13 schematically shows a structure of an array of a semiconductor memory device according to an embodiment 2 of the invention.

FIG. 13 shows a structure of a main portion of a semiconductor memory device according to an embodiment 2 of the invention. In FIG. 13, a memory cell array is divided into a plurality of memory blocks MB00–MBnn each having a plurality of memory cells MC arranged in a matrix form. Memory blocks MBi0–MBin arranged in each row form a row block, and word line WL extends throughout the memory blocks in the row block. For example, memory blocks MB00–MB0n form one row block. Memory blocks MB0j–MBmj arranged in a column form one column block. Column select signal line CSL is arranged commonly to the memory blocks in the same column block.

Column decode circuits CD0–CDn are arranged correspondingly to the column blocks, respectively. Column decode circuits CD0–CDn receives both peripheral internal power supply voltage VccP and array internal power supply voltage VccA as the operation power supply voltages. A portion generating the column designating signal receives peripheral internal power supply voltage VccP as one operation power supply voltage thereof. An output stage for transmitting the column select signal onto the column select line receives array internal power supply voltage VccA as one of the operation power supply voltage thereof.

Local I/O buses LIOP00–LIOPmn are arranged for memory blocks MB00–MBmn, respectively. Local I/O buses LIOP00–LIOPmn transmit data to and from only the corresponding memory blocks, respectively. Each of local I/O buses LIOP00–LIOPmn can have an appropriate bus width (bit width).

Global I/O buses GIOP0–GIOPn are arranged correspondingly to the column blocks, respectively. Global I/O buses GIOP0–GIOPn transmit data to and from only the memory blocks included in the corresponding column blocks, respectively.

Row block select switches RSW00–RSWmn, which are turned on in response to the row block select signal, are arranged between the local I/O buses and the corresponding global I/O buses. The local I/O buses of the row block including a selected word line are connected to the corresponding global I/O buses GIOP0–GIOPn, respectively. Selection of the row block is performed by decoding predetermined address bits (block address) included in the row address signal. Therefore, connection between the local I/O bus and the global I/O bus is made in accordance with activation of row address strobe signal /RAS.

Corresponding to global I/O buses GIOP0–GIOPn, there are arranged read/write circuits RW0–RWn, which perform data transmission, each receiving peripheral internal power supply voltage VccP as one operation power supply voltage thereof.

Figure 14:
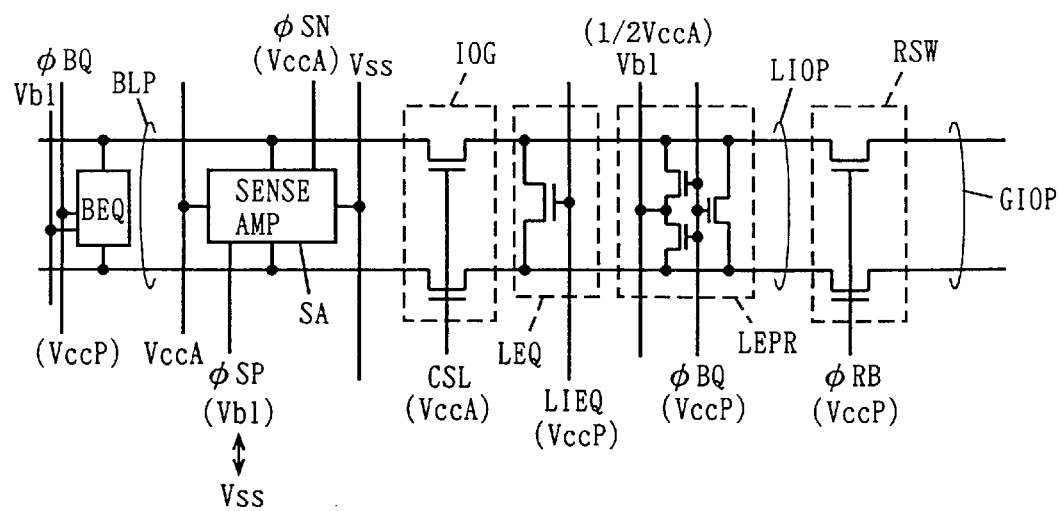
FIG. 14 schematically shows a structure of a connection path from a bit line pair to a global data line pair in the semiconductor memory device shown in FIG. 13.

A structure including the local I/O buses and the global I/O buses shown in FIG. 13 is called a hierarchical data line structure, and can perform transmission of multi-bit data without increasing an area occupied by interconnection lines. FIG. 14 schematically shows a connection structure of one bit line pair, the local I/O line pair and the global I/O line pair in the hierarchical data lines. Global I/O line pair GIOP is electrically connected to local I/O line pair LIOP through a row block select switch RSW. Row block select switch RSW receives a row block select signal φRB at the voltage level of peripheral internal power supply voltage VccP.

For local I/O line pair, there is provided a data line equalize/precharge circuit PR which is responsive to data line equalize instructing signal φBQ for being activated to precharge and equalize the local I/O lines included in local I/O line pair LIOP to the voltage level of intermediate voltage Vb1 (=VccA/2), and an equalize circuit LEQ which is responsive to a local data line equalize instructing signal LIEQ for equalizing the voltage levels on the I/O lines included in the local I/O line pair LIOP.

Data line equalize instructing signal φBQ is at the voltage level of peripheral internal power supply voltage VccP, and is activated and deactivated in response to row address strobe signal /RAS. Data line equalize instructing signal LIEQ is activated and deactivated in response to address transition detection signal ATD. Therefore, local I/O line equalize instructing signal LIEQ is equivalent to internal data line equalize instructing signal IOEQ in the embodiment 1 already described, and can be activated to attain the voltage level of peripheral internal power supply voltage VccP.

Local I/O line pair LIOP is electrically connected to bit line pair BLP through I/O gate circuit IOG. I/O gate circuit IOG receives column select signal CSL (i.e., signal on the column select signal line) from the column decode circuit. Column select signal CSL is at the voltage level of array internal power supply voltage VccA.

For bit line pair BLP, there is arranged sense amplifier circuit SA which is responsive to activation of sense amplifier activating signals φSP and φSN, for being activated to differentially amplify the potentials on bit lines of bit line pair BLP. Sense amplifier activating signal φSN is driven to the voltage level of internal power supply voltage VccA for the array when it is activated. Sense amplifier activating signal φSP is driven to the voltage level of ground voltage Vss when activate. Sense amplifier activating signals φSP and φSN are at the level of intermediate voltage Vb1 in a standby state. Sense amplifier activating signals φSP and φSN are equivalent to those shown in FIG. 9 already described.

When sense amplifier circuit SA is active, array internal power supply voltage VccA is transmitted to the bit line of bit line pair BLP at a higher potential.

For bit line pair BLP, there is further provided bit line equalize circuit BEQ which is activated, when bit line equalize instructing signal φBQ is activated, to transmit intermediate voltage Vb1 onto each bit line of bit line pair BLP. The structure of bit line equalize circuit BEQ is the same as that of a local I/O line pair equalize circuit LEPR. Bit line equalize instructing signal φBQ is at the voltage level of peripheral internal power supply voltage VccP, and is the same as equalize instructing signal φBQ applied to the local I/O line equalize circuit. Equalize instructing signal φBQ is used for precharging and equalizing sense amplifier activating signals φSP and φSN to the intermediate voltage level in a standby state (see FIG. 9).

The structures shown in FIGS. 13 and 14 differ from those of the embodiment 1 only in that the internal I/O lines form the hierarchical structure including the local data buses and global data buses. Selection of the row and column blocks are performed in accordance with predetermined bits included in the row address signal and column address signal, respectively. The word line only in the selected row block is driven to the selected state.

According to this hierarchical data line structure, global I/O line pair GIOP and local I/O line pair LIOP are electrically connected together while row address strobe signal /RAS is active. In accordance with transition in column address signal, equalize instructing signal LIEQ for the local I/O line pair is activated. Therefore, local I/O line pair LIOP is connected to global I/O line pair GIOP, and consequently a larger load is connected to bit line pair BLP. This may increase the probability that inversion of the latched data of sense amplifier circuit SA is caused due to collision of data which occurs while select signal CSL is active if the local data line pair LIOP is not equalized sufficiently.

By setting column select signal CSL to the voltage level of array internal power supply voltage VccA, a balance can be kept between the current driving capability of the MOS transistors included in sense amplifier circuit SA and that of the I/O gate transistors, and therefore inversion of data of sense amplifier circuit SA does not occur.

Figure 15:
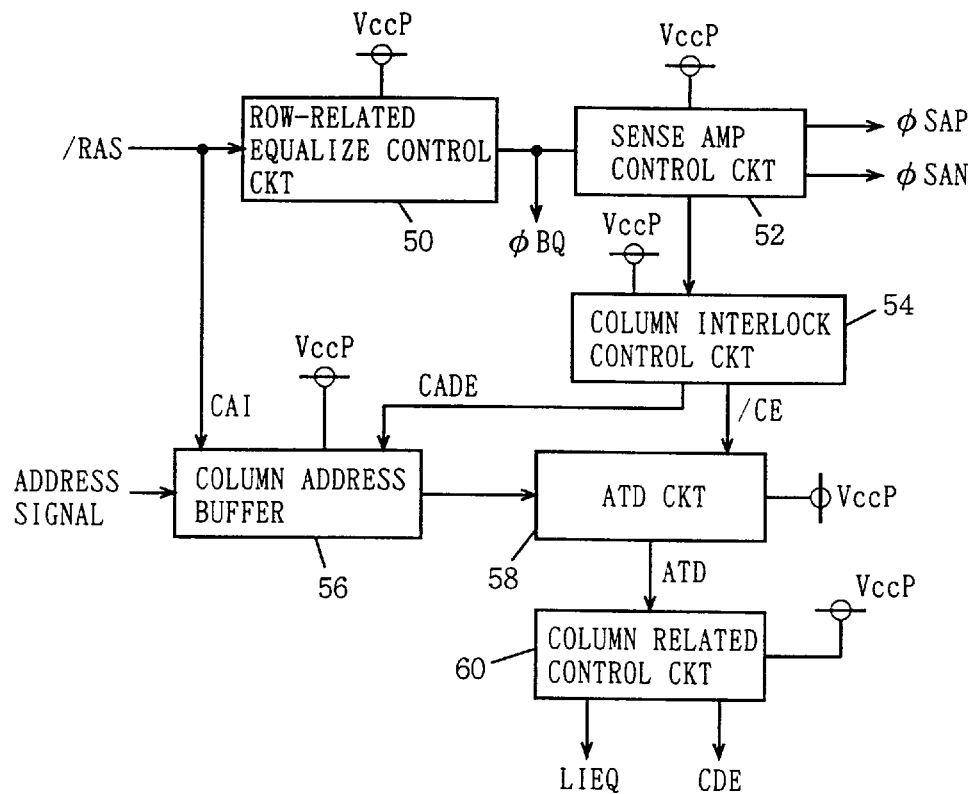
FIG. 15 schematically shows a structure of a portion generating control signals shown in FIG. 14.

FIG. 15 schematically shows a structure of a portion generating various control signals shown in FIG. 14. In FIG. 15, the timing control circuit includes a row-related equalize control circuit 50 which receives peripheral internal power supply voltage VccP as one operation power supply voltage thereof, and generates equalize instructing signal φBQ in response to row address strobe signal /RAS, a sense amplifier control circuit 52 which receives peripheral internal power supply voltage VccP as one operation power supply voltage thereof, and generates sense amplifier drive signals φSAP and φSAN in accordance with an output signal of row-related equalize control circuit 50, and a column interlock control circuit 54 which receives peripheral internal power supply voltage VccP as one operation power supply voltage thereof, and generates column enable signal /CE and column address enable signal CADE in accordance with an output signal of sense amplifier control circuit 52.

Sense amplifier drive signals φSAP and φSAN generated from sense amplifier control circuit 52 are used for driving sense amplifier activating signals φSP and φSN to the active state. This structure is the same as the structures shown in FIGS. 9 and 20. In this embodiment 2, however, only the sense amplifier provided for the selected memory block is driven to the active state. Therefore, the actual sense amplifier drive signal is produced by combination of the sense amplifier activating signal and the row block designating address.

The timing control circuit includes a column address buffer 56 which receives peripheral internal power supply voltage VccP as one operation power supply voltage thereof, receives column address inhibiting signal CAI produced in accordance with row address strobe signal /RAS and generates the internal address signal based on the externally supplied address signal in accordance with column address enable signal CADE from column interlock control circuit 54, an ATD circuit 58 which receives peripheral internal power supply voltage VccP as one operation power supply voltage thereof, and detects the time of transition in the internal column address signal applied from column address buffer 56, and a column-related control circuit 60 which receives peripheral internal power supply voltage VccP as one operation power supply voltage thereof, and generates local I/O line pair equalize instructing signal LIEQ and column decoder enable signal CDE in accordance with address transition detection signal ATD from ATD circuit 58. Column decoder enable signal CDE is applied to column decode circuits CD0–CDn shown in FIG. 13.

Control signals for the selected memory block are produced from combinations of the output signals of the timing control circuit shown in FIG. 15 and the row block designating address signal. The nonselected memory blocks, i.e., blocks not including the selected memory cells are maintained at the precharged state.

[Modification]

Figure 16:
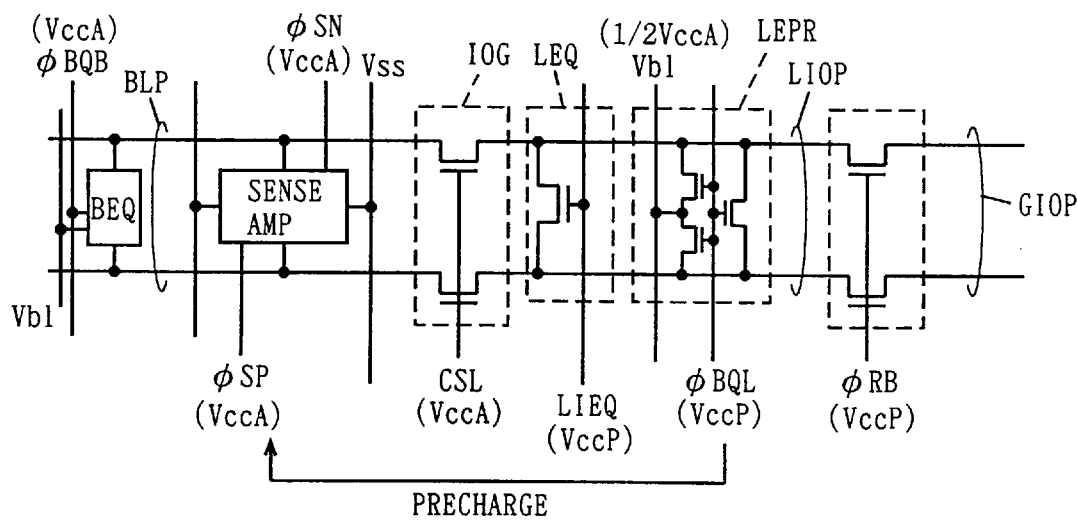
FIG. 16 schematically shows a structure of a modification of the embodiment 2 of the invention.
Figure 17:
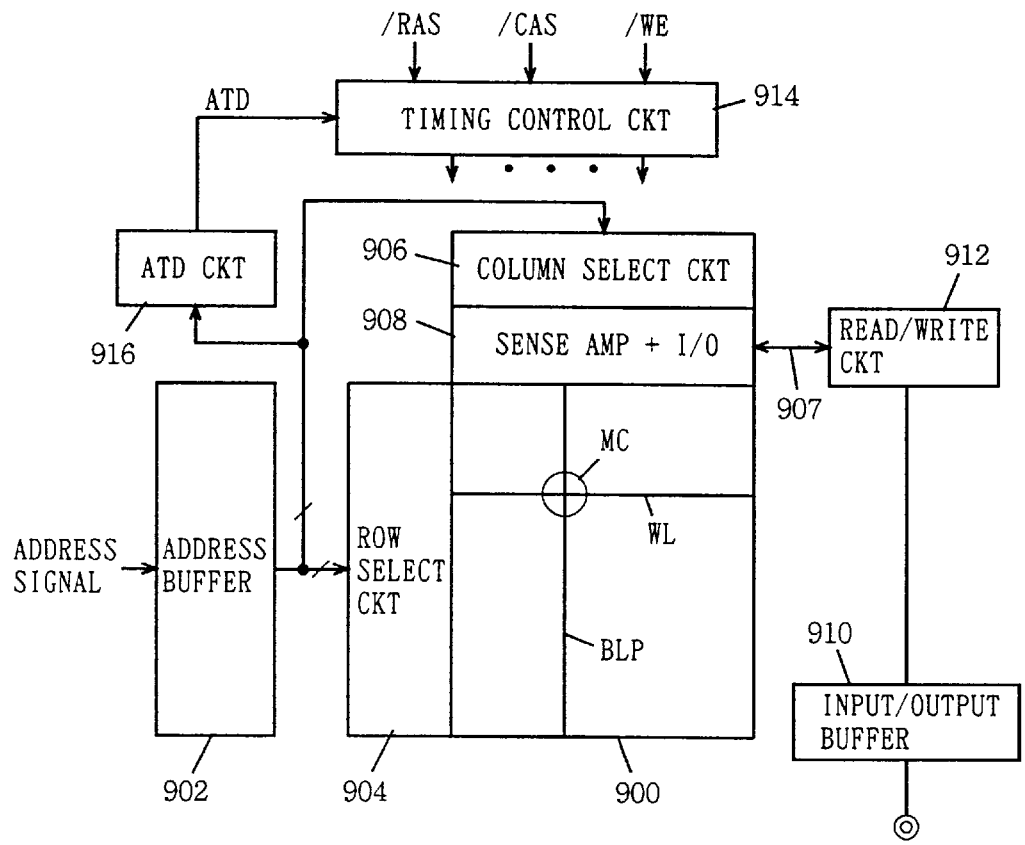
FIG. 17 schematically shows a whole structure of a semiconductor memory device in the prior art.
Figure 18:
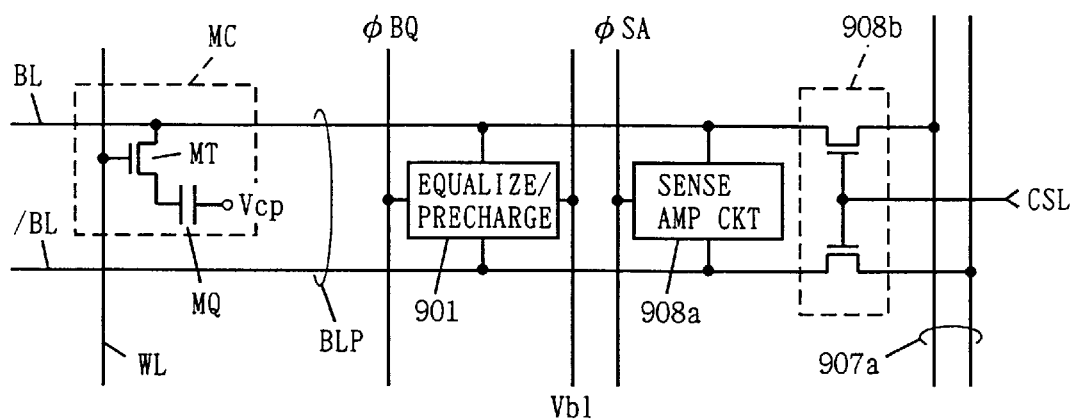
FIG. 18 schematically shows a structure of an array of the semiconductor memory device shown in FIG. 17.
Figure 19:
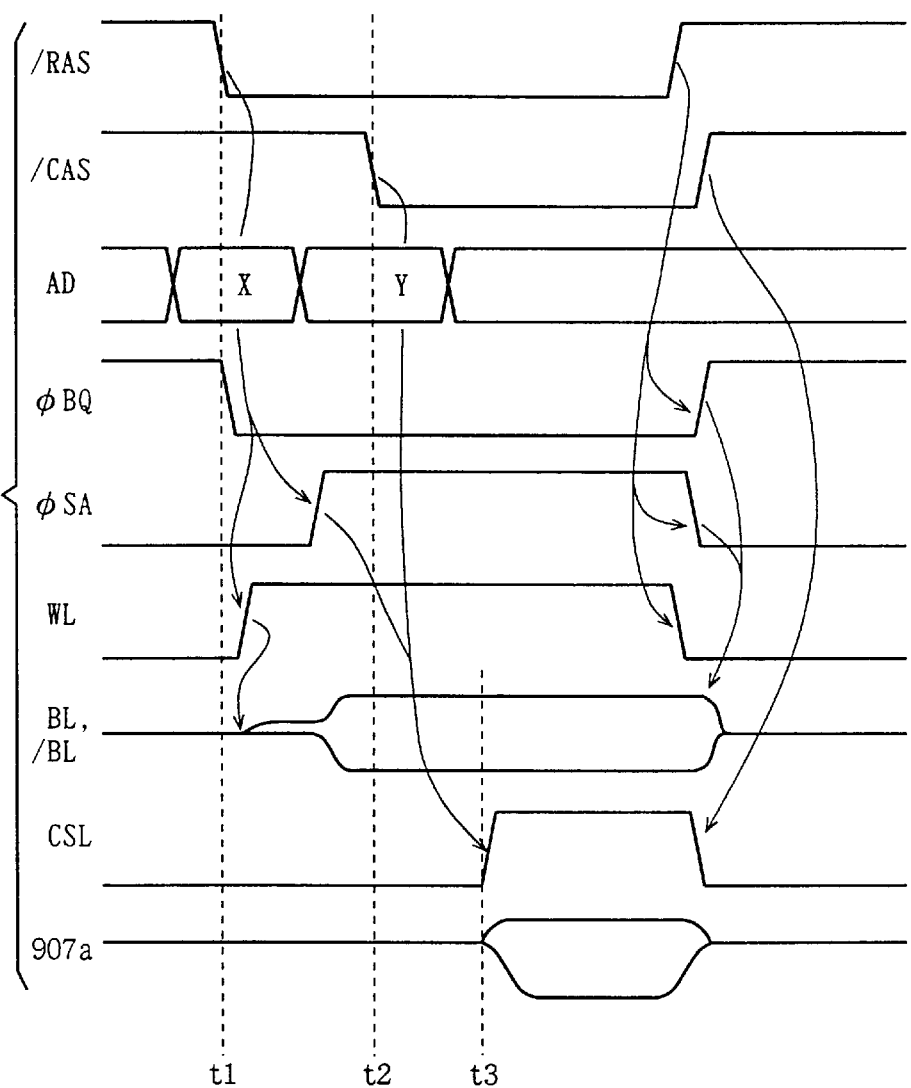
FIG. 19 is a signal waveform diagram representing an operation of the semiconductor memory device in the prior art.

FIG. 16 shows a structure of a main portion of a modification of the embodiment 2 of the invention. FIG. 16 shows a structure of a portion related to one bit line pair BLP, local I/O line pair LIOP and global I/O line pair GIOP. The structure shown in FIG. 16 differs from that shown in FIG. 14 in the following point. Internal data line equalize instructing signal φBQL applied to local I/O line pair equalize/precharge circuit LEPR which is provided for local I/O line pair LIOP is different in voltage level from bit line equalize instructing signal φBQB applied to bit line equalize/precharge circuit BEQ provided for bit line pair BLP.

Bit line equalize instructing signal φBQB is at the voltage level of array internal power supply voltage VccA, and local I/O line pair equalize instructing signal φBQL is at the voltage level of peripheral internal power supply voltage VccP. Local I/O line pair equalize instructing signal φBQL is also used for precharging and equalizing sense amplifier activating signals φSP and φSN to the intermediate voltage level during standby. Structures other than the above are the same as those shown in FIG. 14. Corresponding portions bear the same reference numerals, and will not be described below.

In the structure shown in FIG. 16, two signals, i.e., bit line equalize instructing signal φBQB and local I/O line pair equalize instructing signal φBQL are used as the equalize instructing signals. These signals are activated and deactivated at the substantially same timings in response to row address strobe signal /RAS. However, bit line equalize instructing signal φBQB for bit line equalize/precharge circuit BEQ may be at he voltage level of array internal power supply voltage VccA, whereby it is possible to ensure the reliability of gate insulating films of the MOS transistors included in bit line equalize circuit BEQ, and all the signals transmitted in the memory cell array can be signals at voltage levels varying between internal power supply voltage VccA and ground voltage Vss (except for the word line drive signal having the voltage level 3/2 times higher than power supply voltage VccA).

In the structure shown in FIG. 16, column select signal CSL applied to I/O gate circuit IOG is at the voltage level of array internal power supply voltage VccA, and inversion of data of sense amplifier circuit SA does not occur even when collision of data occurs due to insufficient equalizing of local I/O line pair LIOP.

Read/write circuit RW shown in FIG. 13 may receive array internal power supply voltage VccA as one power supply voltage thereof.

According to the embodiment 2 of the invention, the semiconductor memory device having the hierarchical data line structure, which includes global data buses and local data buses, can prevent inversion of data of the sense amplifier circuit even when collision of data occurs due to insufficient equalizing of local I/O line pair LIOP, because the voltage level of the column select signal, which is applied to the I/O gate circuit for connection between the local I/O bus and the selected bit line pair, is at the voltage level of the array internal power supply voltage. Therefore, data reading can be performed accurately. Also, it is not necessary to increase the equalizing period for preventing insufficient equalization, so that fast access can be achieved.

It is merely required to set the voltage level of the column select signal to the control internal power supply voltage level. It is not necessary to readjust the sizes of MOS transistors included in the sense amplifier circuit and transfer gate transistors forming the I/O gate in accordance with this peripheral internal power supply voltage level, and it is easy to accommodate change of power supply voltage.

In the aforementioned embodiments 1 and 2, internal data lines and local I/O lines are equalized when the column address changes. Alternatively, such a structure may be employed that internal data lines and local I/O lines are not equalized when the column address changes.

According to the invention, as described above, the voltage level of the column select signal applied to the I/O gate circuit, which is provided for connecting the bit line pair to the internal data line pair is at the same voltage level as the array internal power supply voltage, which the sense amplifier uses as one operation power supply voltage thereof. Therefore, a balance can be kept between the current driving capability of the I/O gate circuit and that of the MOS transistors of the sense amplifier circuit, so that inversion of the latched data of the sense amplifier circuit does not occur even when collision of data occurs due to insufficient equalizing of the internal data line pair, and therefore accurate data reading can be performed without increasing the access time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of internal power supply circuits for generating a plurality of internal power supply voltages at different voltage levels, respectively;

a memory cell array having a plurality of memory cells arranged in rows and columns;

a plurality of bit line pairs arranged corresponding to said columns and connected to the memory cells on the corresponding columns, respectively;

a plurality of word lines arranged corresponding to said rows and connected to the memory cells on the corresponding rows, respectively;

a plurality of sense amplifiers arranged corresponding to said plurality of bit line pairs for differentially amplifying potentials on the corresponding bit line pairs when made active, each of said sense amplifiers including a circuit portion for transmitting a first internal power supply voltage generated from a first internal power supply circuit included in said plurality of internal power supply circuits to a bit line of a corresponding bit line pair at a higher potential when activated;

column select means for generating a column select signal selecting an addressed column among said plurality of columns in accordance with an address signal, said column select means including means for generating the column select signal at a level of said first internal power supply voltage;

a column select gate for electrically coupling, in accordance with said column select signal, the bit line pair arranged corresponding to the addressed column to an internal data line pair; and a peripheral circuit receiving a second internal power supply voltage higher than said first internal power supply voltage as one operation power supply voltage thereof, and performing an operation related at least to row selection for said plurality of rows in accordance with an externally applied signal.

2. The semiconductor memory device according to claim 1, wherein said means for generating the column select signal includes:

means receiving said second internal power supply voltage as one operation power supply voltage thereof, to generate a column designating signal by decoding said address signal; and means receiving said first internal power supply voltage as one operation power supply voltage thereof, to generate said column select signal in accordance with said column designating signal.

3. The semiconductor memory device according to claim 1, wherein said memory cell array is divided into a plurality of memory blocks arranged in at least one row and each having a plurality of memory cells arranged in rows and columns, said internal data line pair includes a plurality of local data line pairs provided corresponding to said plurality of memory blocks respectively, and wherein said semiconductor memory device further comprises:

local data line equalize means for equalizing potentials on said local data line pair in response to transition in column address signal designating a column included in said address signal; and a global data line pair provided commonly to the memory blocks arranged in one row and selectively connected to a local data line pair provided corresponding to a memory block including the selected memory cell.

4. The semiconductor memory device according to claim 1, further comprising:

data line equalize means for equalizing potentials on said internal data line pair in response to transition of a column address signal designating a column in said columns included in said address signal.

5. The semiconductor memory device according to claim 1, further comprising pull up means provided for said internal data line pair for pulling up potentials on said internal data line pair when activated in response to inactivation of a data write instruction signal.

6. The semiconductor memory device according to claim 5, wherein said pull up means pulls up the potentials on the internal data line pair to the first internal power supply voltage.

* * * * *